(12) United States Patent
Wani et al.

(10) Patent No.: US 11,519,146 B2
(45) Date of Patent: *Dec. 6, 2022

(54) FLOOD MONITORING AND MANAGEMENT SYSTEM

(71) Applicant: One Concern, Inc., Palo Alto, CA (US)

(72) Inventors: Ahmad Wani, Mountain View, CA (US); Nicole Hu, Mountain View, CA (US); Wang Zhan, Palo Alto, CA (US); Seungjin Baek, Palo Alto, CA (US); Jessica Frank, Palo Alto, CA (US)

(73) Assignee: ONE CONCERN, INC., Menlo Park, CA (US)

( * ) Notice: Subject to any disclaimer, the term of this patent is extended or adjusted under 35 U.S.C. 154(b) by 246 days.

This patent is subject to a terminal disclaimer.

(21) Appl. No.: 15/954,792

(22) Filed: Apr. 17, 2018

(65) Prior Publication Data
US 2019/0316309 A1  Oct. 17, 2019

(51) Int. Cl.
*G06F 30/20* (2020.01)
*E02B 1/02* (2006.01)
(Continued)

(52) U.S. Cl.
CPC .............. *E02B 1/02* (2013.01); *G06F 3/0482* (2013.01); *G06F 3/0484* (2013.01); *G06F 16/29* (2019.01);
(Continued)

(58) Field of Classification Search
CPC ... E02B 1/02; E02B 1/00; G06F 16/29; G06F 30/20; G06F 3/0482; G06F 3/0484;
(Continued)

(56) References Cited

U.S. PATENT DOCUMENTS 7,136,756 B1 * 11/2006 Vieux ..................... G06T 17/05
                                                            702/5
8,280,633 B1 * 10/2012 Eldering ............... G06Q 40/08
                                                            702/3
(Continued)

FOREIGN PATENT DOCUMENTS

CN  104318085 A  *  1/2015  ............. Y02A 90/10
CN  105654414 A  *  6/2016  ............. G06Q 50/26
(Continued)

OTHER PUBLICATIONS

Leskens et al, "An interactive simulation and visualization tool for flood analysis usable for practitioners", 2017, Springer (Year: 2017).*

(Continued)

*Primary Examiner* — Kandasamy Thangavelu
(74) *Attorney, Agent, or Firm* — Schwegman Lundberg & Woessner, P.A.

(57) ABSTRACT

Methods, systems, and computer programs are presented for a flood-recovery analysis tool. One method includes operations for accessing weather information for a geographical region divided into cells and for generating runoff data based on the weather information. The runoff data includes a predicted amount of free-running water on a surface of each cell of the region. Further, the method includes operations for generating a prediction of inflow and outflow of water between cells, and for calculating, for a plurality of sub-cells of each cell in the geographical region, a predicted water depth in each sub-cell based on the prediction of the inflow and outflow between cells and a hydraulic model. Additionally, the method includes operations for generating a flood inundation map showing the predicted water depth at each sub-cell in the geographical region, and for causing presen- (Continued)

tation of the flood inundation map in a user interface of a display device.

14 Claims, 31 Drawing Sheets

(51) Int. Cl.
| | |
|---|---|
| *G06F 3/0484* | (2022.01) |
| *G09B 29/10* | (2006.01) |
| *G06F 3/0482* | (2013.01) |
| *G09B 29/00* | (2006.01) |
| *G06F 16/29* | (2019.01) |

(52) U.S. Cl.
CPC ........... *G06F 30/20* (2020.01); *G09B 29/007* (2013.01); *G09B 29/106* (2013.01)

(58) Field of Classification Search
CPC ..... G06F 30/23; G09B 29/007; G09B 29/106; G06K 9/6215; G06Q 10/06; G06Q 40/08; G06Q 50/26; G09T 7/262; Y02A 90/10
USPC .......................................................... 703/9
See application file for complete search history.

(56) References Cited

U.S. PATENT DOCUMENTS

| | | | | |
|---|---|---|---|---|
| 8,655,595 | B1 * | 2/2014 | Green ................... | G06Q 50/16 |
| | | | | 702/5 |
| 8,914,266 | B2 | 12/2014 | Mchenry et al. | |
| 9,159,132 | B1 * | 10/2015 | Crowsey ................. | G06T 7/262 |
| 9,965,808 | B1 * | 5/2018 | Kunz ..................... | G06Q 40/12 |
| 10,664,937 | B2 | 5/2020 | Wani et al. | |
| 10,740,684 | B1 * | 8/2020 | Wani ...................... | G06N 7/005 |
| 10,762,588 | B2 | 9/2020 | Wani et al. | |
| 2004/0133530 | A1 | 7/2004 | Smith et al. | |
| 2005/0159882 | A1 * | 7/2005 | Howard ................. | G06Q 10/06 |
| | | | | 340/995.14 |
| 2007/0005680 | A1 * | 1/2007 | Jrad ....................... | G06Q 50/32 |
| | | | | 709/201 |
| 2007/0143019 | A1 | 6/2007 | Feyen et al. | |
| 2011/0145035 | A1 | 6/2011 | Franke et al. | |
| 2011/0191071 | A1 | 8/2011 | Sarkisian et al. | |
| 2014/0056645 | A1 * | 2/2014 | Hogan ................... | G06Q 50/06 |
| | | | | 405/80 |
| 2014/0156190 | A1 * | 6/2014 | Cordazzo ............... | G01W 1/10 |
| | | | | 702/3 |
| 2014/0278561 | A1 * | 9/2014 | Knuffke ................. | G06Q 40/08 |
| | | | | 705/4 |
| 2015/0019262 | A1 | 1/2015 | Du et al. | |
| 2016/0047099 | A1 | 2/2016 | Zhang et al. | |
| 2016/0343093 | A1 * | 11/2016 | Riland ................... | G06Q 10/04 |
| 2017/0039307 | A1 * | 2/2017 | Koger .................... | G06F 30/23 |
| 2018/0075537 | A1 * | 3/2018 | Kaplan .................. | G06Q 40/08 |
| 2019/0318439 | A1 | 10/2019 | Wani et al. | |
| 2019/0318440 | A1 | 10/2019 | Wani et al. | |
| 2021/0256614 | A1 * | 8/2021 | Tofte .................... | G06K 9/6215 |

FOREIGN PATENT DOCUMENTS

| | | | | |
|---|---|---|---|---|
| CN | 107451716 A | * | 12/2017 | ............ G06Q 50/26 |
| CN | 107816031 A | * | 3/2018 | ............... E02D 3/00 |
| JP | 2002092264 | | 3/2002 | |
| JP | 2002269656 | | 9/2002 | |
| JP | 2003296504 | | 10/2003 | |
| JP | 2004197554 | | 7/2004 | |
| JP | 2006004212 | | 1/2006 | |
| JP | 2008083167 | | 4/2008 | |
| JP | 4511560 B2 | * | 7/2010 | ............ G08B 21/00 |
| JP | 2017201243 A | * | 11/2017 | |
| JP | 2021518889 A | | 8/2021 | |
| KR | 20150040505 A | * | 4/2015 | ............ H04W 4/02 |
| WO | WO 2015112892 A1 | * | 7/2015 | ............ G06Q 10/04 |
| WO | 2019204254 | | 10/2019 | |

OTHER PUBLICATIONS

Koger et al. (U.S. Patent Application Publication 2017/0039307), Feb. 2017, see shortened version.*
Tofte et al. (U.S. Patent Application Publication 2021/0256614), Aug. 2021, see shortened version.*
Howard et al. (U.S. Patent Application Publication 2005/0159882), Jul. 2005, see shprtened version.*
"U.S. Appl. No. 15/954,829, Response filed Jan. 24, 2020 to Non Final Office Action dated Sep. 25, 2019", 21 pgs.
"U.S. Appl. No. 15/954,829, Notice of Allowance dated Feb. 20, 2020", 11 pgs.
Amirebrahimi, Sam, "A Data Model for Integrating GIS and BIM for Assessment and 3D Visualization of Flood Damage to Building", CEUR Workshop Proceedings 1323, CEUR-WS, (Jan. 1, 2015), 78-89.
Tanaka, Tomohiro, "Impact Assessment of Upstream Flooding on Extreme Flood Frequency Analysis by Incorporating A Flood-Inundation Model for Flood Risk Assessment", Journal of Hydrology 554, (2017), 370-382.
"U.S. Appl. No. 15/954,803, Non Final Office Action dated Sep. 19, 2019", 17 pgs.
"U.S. Appl. No. 15/954,829, Non Final Office Action dated Sep. 25, 2019", 22 pgs.
Johannes, G Leskens, "An interactive simulation and visualization tool for flood analysis usable for practitioners", Mitigation and Adaptation Strategies for Global Change. vol. 22, Issue 2, (Feb. 2017), 307-324.
"U.S. Appl. No. 15/954,803, Response filed Jan. 20, 2020 to Non Final Office Action dated Sep. 19, 2019", 20 pgs.
"International Application Serial No. PCT US2019 027600, International Search Report dated Jul. 2, 2019", 2 pgs.
"International Application Serial No. PCT US2019 027600, Written Opinion dated Jul. 2, 2019", 11 pgs.
"U.S. Appl. No. 15/954,803, Notice of Allowance dated Apr. 30, 2020", 11 pgs.
"International Application Serial No. PCT/US2019/027600, International Preliminary Report on Patentability dated Oct. 29, 2020", 13 pgs.
"Japanese Application Serial No. 2020-557248, Notification of Reasons for Refusal dated Nov. 2, 2021", w English Translation, 24 pgs.
"Japanese Application Serial No. 2020-557248, Response Filed Feb. 18, 2022 to Notification of Reasons for Refusal dated Nov. 2, 2021", W/ English Claims, 23 pgs.

* cited by examiner

FLOOD MONITORING AND MANAGEMENT SYSTEM

TECHNICAL FIELD

The subject matter disclosed herein generally relates to methods, systems, and programs for natural disaster management, and more particularly, flood damage prediction and inundation mitigation planning.

BACKGROUND

Natural phenomena, such as earthquakes, flooding, and fires, may cause considerable damage to life and property. Predicting the extent of such damage may assist in prioritizing emergency services to those most affected by the earthquakes, flooding, and fires.

When a storm is expected to arrive to an area that might be flooded, predicting which areas will be inundated, and to what degree, is a difficult proposition due to the many factors involved in the prediction, such as weather patterns, geography, type of surface, etc.

In addition, predicting what future flood disasters may occur is difficult, especially in a time of climate change. Sometimes, government officials have funds to take measures to mitigate possible damage by future flood-causing events, but determining the best way to spend those funds is problematic because it is hard to assess the benefits of spending money on different damage-reduction measures.

BRIEF DESCRIPTION OF THE DRAWINGS

Various ones of the appended drawings merely illustrate example embodiments of the present disclosure and cannot be considered as limiting its scope.

DETAILED DESCRIPTION

Figure 1:
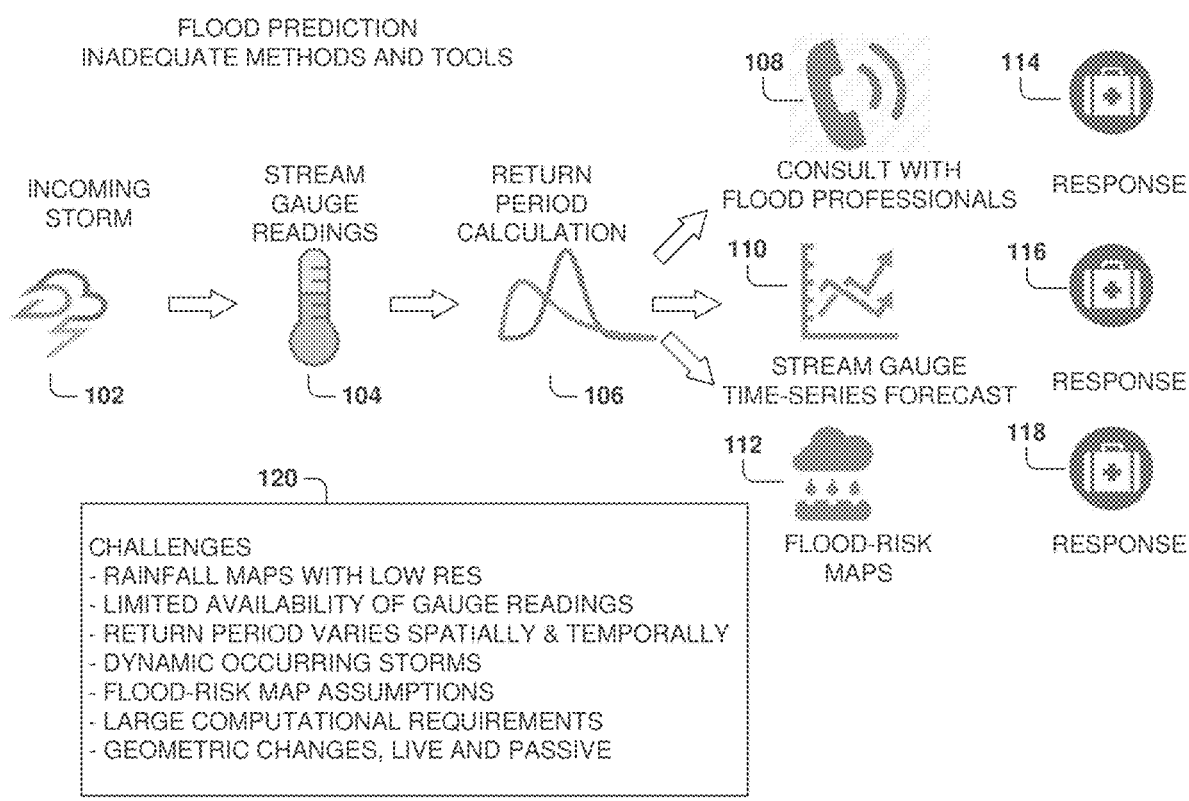
FIG. 1 illustrates the challenges of predicting devastation from floods, according to some example embodiments.

Example methods, systems, and computer programs are directed to a flood monitoring and management system. Examples merely typify possible variations. Unless explicitly stated otherwise, components and functions are optional and may be combined or subdivided, and operations may vary in sequence or be combined or subdivided. In the following description, for purposes of explanation, numerous specific details are set forth to provide a thorough understanding of example embodiments. It will be evident to one skilled in the art, however, that the present subject matter may be practiced without these specific details.

Preparing for natural disasters is difficult for city officials due, in part, to the difficulty in predicting the natural disasters. In particular, preparing for flooding when a big storm is coining is difficult because many of the tools are static and do not take into consideration the weather patterns and the topography of the region. Often, city officials have to rely on experts or static inundation maps based on past history. But these methods provide low-confidence results and do not give the city officials the proper tools to plan for flooding.

Presented herein is a flood analysis system, also referred to as a flood management system, with versatile tools to prepare for flooding, in advance of an upcoming weather storm or when planning for possible future flooding scenarios. When an incoming weather storm is identified, the flood analysis system gathers weather information to generate a flood inundation map that identifies possible areas for flooding. The flood analysis system also has information about the region of interest to provide accurate estimates of how the water may flow through the area over time.

The flood inundation map includes a timeline bar which shows the inundation as time progresses. The user may click on the timeline bar and see how inundation may look the next day, three days later, five days later, etc. The time series for the inundation data allows the city official to see how flooding may occur over time. The flood analysis system also estimates the damages caused by flooding in the region and may indicate the cost-benefit analysis for implementing mitigation measures.

In addition, the flood analysis system allows the user to configure mitigation measures (e.g., placing sandbags) and observe how the mitigation measures change the inundation map at the different times.

Additionally, city planners may utilize the flood analysis system to generate flood risk maps that identify which areas in the map are more likely to be flooded in the future. The city planners may also create plans to reduce damages, such as by elevating structures or buying land to change its use, and see the cost-benefit analysis of those plans.

In one embodiment, a method is provided. The method includes operations operation for accessing weather information for a geographical region that is divided into cells and generating runoff data based on the weather information. The runoff data includes a predicted amount of free-running water on a surface of each cell of the geographical region. Further, the method includes operations for generating a prediction of inflow and outflow of water between cells, and for calculating, for a plurality of sub-cells of each cell in the geographical region, a predicted water depth in each sub-cell based on the prediction of the inflow and outflow between cells and a hydraulic model. Additionally, the method includes operations for generating a flood inundation map showing the predicted water depth at each sub-cell in the geographical region, and for causing presentation of the flood inundation map in a user interface of a display device.

In another embodiment, a system includes a memory comprising instructions and one or more computer processors. The instructions, when executed by the one or more computer processors, cause the one or more computer processors to perform operations comprising: accessing weather information for a geographical region that is divided into cells; generating runoff data based on the weather information, the runoff data including a predicted amount of free-running water on a surface of each cell of the geographical region; generating a prediction of inflow and outflow of water between cells; calculating, for a plurality of sub-cells of each cell in the geographical region, a predicted water depth in each sub-cell based on the prediction of the inflow and outflow between cells and a hydraulic model; generating a flood inundation map showing the predicted water depth at each sub-cell in the geographical region; and causing presentation of the flood inundation map in a user interface of a display device.

In yet another embodiment, a non-transitory machine-readable storage medium includes instructions that, when executed by a machine, cause the machine to perform operations comprising: accessing weather information for a geographical region that is divided into cells; generating runoff data based on the weather information, the runoff data including a predicted amount of free-running water on a surface of each cell of the geographical region; generating a prediction of inflow and outflow of water between cells; calculating, for a plurality of sub-cells of each cell in the geographical region, a predicted water depth in each sub-cell based on the prediction of the inflow and outflow between cells and a hydraulic model; generating a flood inundation map showing the predicted water depth at each sub-cell in the geographical region; and causing presentation of the flood inundation map in a user interface of a display device.

In one embodiment, a method is provided. The method includes an operation for generating a prediction of water depth in a geographical region based on weather data for the geographical region and topography data for the geographical region. The method further includes an operation for causing presentation of a flood inundation map showing the prediction of water depth in a user interface of a display device, the user interface comprising an option for entering flood mitigation measures. After the flood mitigation measures are received via the user interface, the topography data is updated to include the received flood mitigation measures. The method further includes operations for generating an updated prediction of the water depth in the geographical region based on the updated topography data, and for causing presentation of an updated flood inundation map in the user interface, the updated flood inundation map showing the updated prediction of the water depth and a geographical location of the flood mitigation measures.

In another embodiment, a system includes a memory comprising instructions and one or more computer processors. The instructions, when executed by the one or more computer processors, cause the one or more computer processors to perform operations comprising: generating a prediction of water depth in a geographical region based on weather data for the geographical region and topography data for the geographical region; causing presentation of a flood inundation map showing the prediction of water depth in a user interface of a display device, the user interface comprising an option for entering flood mitigation measures; receiving the flood mitigation measures via the user interface; updating the topography data to include the received flood mitigation measures; generating an updated prediction of the water depth in the geographical region based on the updated topography data; and causing presentation of an updated flood inundation map in the user interface, the updated flood inundation map showing the updated prediction of the water depth and a geographical location of the flood mitigation measures.

In yet another embodiment, a non-transitory machine-readable storage medium includes instructions that, when executed by a machine, cause the machine to perform operations comprising: generating a prediction of water depth in a geographical region based on weather data for the geographical region and topography data for the geographical region; causing presentation of a flood inundation map showing the prediction of water depth in a user interface of a display device, the user interface comprising an option for entering flood mitigation measures; receiving the flood mitigation measures via the user interface; updating the topography data to include the received flood mitigation measures; generating an updated prediction of the water depth in the geographical region based on the updated topography data; and causing presentation of an updated flood inundation map in the user interface, the updated flood inundation map showing the updated prediction of the water depth and a geographical location of the flood mitigation measures.

In one embodiment, a method is provided. The method includes an operation for causing presentation, in a graphical user interface, of options for calculating a flood risk map. Further, the method includes operations for receiving, via the graphical user interface, input identifying a geographical region and a weather scenario for calculating the flood risk map, and dividing the geographical region into at least a plurality of cells. Additionally, the method includes operations for calculating, utilizing a hydrological model, an inflow and an outflow of water between cells in the geographical region based on the weather scenario, and for calculating, utilizing a hydraulic model, water depth in each cell based on the weather scenario and the inflow and the outflow of water between cells. The flood risk map is generated based on the calculated water depth in each cell, the flood risk map showing a probability that each cell in the geographical region will be inundated with water under the weather scenario. Further the method includes an operation for causing presentation of the flood risk map in the graphical user interface.

In another implementation, a system includes a memory comprising instructions and one or more computer processors. The instructions, when executed by the one or more computer processors, cause the one or more computer processors to perform operations comprising: causing presentation, in a graphical user interface, of options for calculating a flood risk map; receiving, via the graphical user interface, input identifying a geographical region and a weather scenario for calculating the flood risk map; dividing the geographical region into at least a plurality of cells; calculating, utilizing a hydrological model, an inflow and an outflow of water between cells in the geographical region based on the weather scenario; calculating, utilizing a hydraulic model, water depth in each cell based on the weather scenario and the inflow and the outflow of water between cells; generating the flood risk map based on the calculated water depth in each cell, the flood risk map showing a probability that each cell in the geographical region will be inundated with water under the weather scenario; and causing presentation of the flood risk map in the graphical user interface.

In yet another implementation, a non-transitory machine-readable storage medium includes instructions that, when executed by a machine, cause the machine to perform operations comprising: causing presentation, in a graphical user interface, of options for calculating a flood risk map; receiving, via the graphical user interface, input identifying a geographical region and a weather scenario for calculating the flood risk map; dividing the geographical region into at least a plurality of cells; calculating, utilizing a hydrological model, an inflow and an outflow of water between cells in the geographical region based on the weather scenario; calculating, utilizing a hydraulic model, water depth in each cell based on the weather scenario and the inflow and the outflow of water between cells; generating the flood risk map based on the calculated water depth in each cell, the flood risk map showing a probability that each cell in the geographical region will be inundated with water under the weather scenario; and causing presentation of the flood risk map in the graphical user interface.

FIG. 1 illustrates the challenges of predicting devastation from floods, according to some example embodiments. Flood prediction has been difficult due to the complexity of the problem and the lack of good tools. In some cases, a weather service may detect an incoming storm 102, and government officials may rely on following stream gauge readings 104 and looking at historical events, such as return period calculations 106.

The government officials may then consult with flood professionals 108 to prepare a response 114, look at historical data from the stream gauges 110 to prepare another response 116, or look at FEMA's flood-risk maps 112 to prepare a third response 118.

However, these methods have proven to be very unreliable for obtaining accurate flood-risk forecasts for multiple reasons 120, such as rainfall maps with very low resolution by geographical area, limited availability of gauge readings throughout the area of interest, spatial and temporal variation of return periods, the dynamic nature of storms, large computational requirements, underlying assumptions for calculating the flood-risk maps, and geometric changes that happen on the land over time.

The embodiments presented herein for flood-risk management provide a variety of tools for flood management that include detailed analysis of multiple inputs (e.g., weather inputs, historical data, and geometric data) and the use of multiple models (e.g., hydrological and hydrodynamic models). These tools provide timely predictions for potential inundation maps and analysis of how effective mitigation measures may be to avoid catastrophes.

Figure 2:
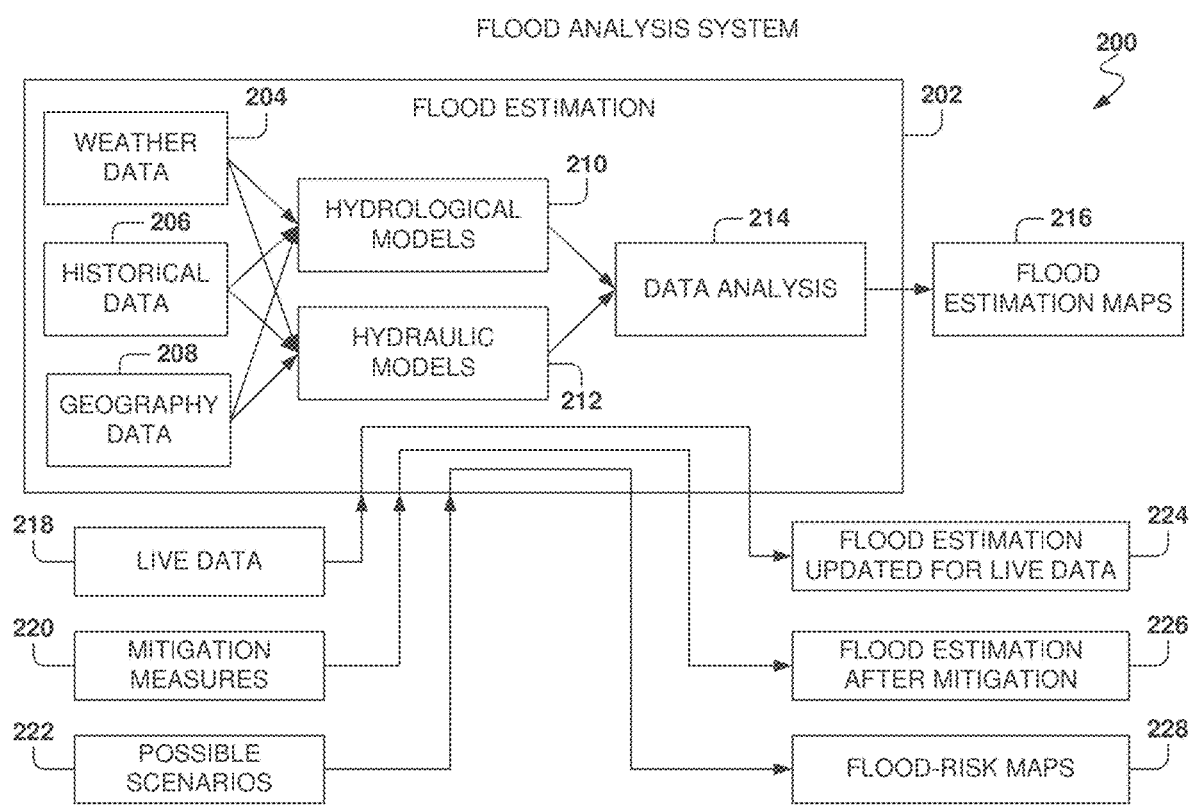
FIG. 2 is a block diagram illustrating a flood analysis system, according to some example embodiments.

FIG. 2 is a block diagram illustrating a flood analysis system 200, according to some example embodiments. The flood analysis system 200 includes a flood estimation module 202 that generates flood estimation maps 216. The flood analysis system 200 may be utilized when a storm is coming to predict possible flooding, and may also be utilized for preparing for future events by analyzing flood risk and evaluating the effectiveness of possible mitigation measures.

In one example embodiment, the flood estimation module 202 utilizes several inputs, including weather data 204, historical data 206, and geographic data 208 to generate the flood estimation maps 216. The weather data 204 includes weather prediction data, such as the weather data generated by the National Weather Service, but any other source of weather information may also be utilized. The weather data 204 may include rainfall estimates by area, satellite pictures, weather warnings, etc.

The historical data 206 includes historical weather-related data as well as flooding data. The historical data 206 may then identify levels of rainfall at different times for a given location (e.g., a city, an area code, a region, a county, etc.), as well as flood levels and the places where flooding occurred.

The geographic data 208 includes information about the geography of an area, such as elevation, type of groundcover (e.g., pavement, grass, or rock), waterways, water-flow obstacles, etc.

The inputs are used by hydrological models 210 and hydraulic models 212 (also referred to herein as hydrodynamic models), and data analysis 214 is performed on the different results from the models to generate the flood estimation maps 216. More details regarding the data analysis are provided below with reference to FIGS. 19-31.

Hydrology is the scientific study of the movement, distribution, and quality of water, including the water cycle, water resources, and environmental watershed sustainability. Using various analytical methods and scientific techniques, hydrology analyzes data to help solve water-related problems such as environmental preservation, natural disasters, and water management.

A phenomenon related to hydrology is infiltration. Infiltration is the process by which water enters the soil. Some of the water is absorbed, and the rest percolates down to the water table. The infiltration capacity, the maximum rate at which the soil can absorb water, depends on several factors. The layer that is already saturated provides a resistance that is proportional to its thickness, while that plus the depth of water above the soil provides the driving force (hydraulic head). Dry soil can allow rapid infiltration by capillary action, which diminishes as the soil becomes wet. Ground compaction reduces the porosity and the pore sizes. Further, surface cover increases capacity by retarding runoff, reducing compaction and other processes.

Hydrology considers quantifying surface water flow and solute transport. Some of the methods for measuring flow, once water has reached a river, include stream gauge and tracer techniques. Precipitation is one of the parameters used in hydrology. Precipitation can be measured in various ways, such as by a disdrometer for precipitation characteristics at a fine time scale; radar for cloud properties, rain rate estimation, and hail and snow detection; rain gauge for routine accurate measurements of rain and snowfall; and satellite for rainy area identification, rain rate estimation, land cover and use, and soil moisture.

A hydrological model 210 is a simplification of a real-world system (e.g., surface water, soil water, wetland, groundwater, or estuary) that aids in understanding, predicting, and managing water resources. Both the flow and quality of water are commonly studied using hydrological models.

There are several types of hydrological models 210, such as conceptual models, analog models, statistical models, and physically based models. Conceptual models are commonly used to represent the important components (e.g., features, events, and processes) that relate hydrological inputs to outputs. These components describe the important functions of the system of interest, and are often constructed using entities (e.g., stores of water) and relationships between these entities (e.g., flows or fluxes between stores). The conceptual model is coupled with scenarios to describe specific events (either input or outcome scenarios). Analog models use non-mathematical approaches to simulate hydrology. The physically based models represent hydrological systems using physical laws. The conceptual model may be used as the starting point for defining the important model components. The relationships between model components are then specified using algebraic equations, ordinary or partial differential equations, or integral equations. The model is then solved using analytical or numerical procedures.

Hydrodynamics studies the flow of liquids in motion. The hydraulic models 212, also referred to as hydrodynamic models, are models that predict the flow of water over the surface of a region of interest. Hydrodynamics is part of a broader field of fluid dynamics that studies the flow of liquids. Several types of hydrodynamic models 212 may be utilized, such as Delft3D Flexible Mesh Suite, Telemac, and Hydrologic Engineering Center's River Analysis System (HEC-RAS), but other hydrodynamic models may also be used.

The flood estimation module 202 may also receive live data 218 (e.g., gauge meter readings) and update the models with the new live data 218 to generate new flood estimation maps updated with the live data 224.

Additionally, the flood analysis system 200 includes a user interface for adding mitigation measures (e.g., placing sandbags at certain locations) and may generate new predictions for flood estimation maps 226 if the mitigation measures are implemented.

Additionally, the flood analysis system 200 may develop flood-risk maps 228 for an area based on the analysis of possible scenarios 222 that may occur in the future. The scenarios may be based on past events or may be created by the user.

Figure 3:
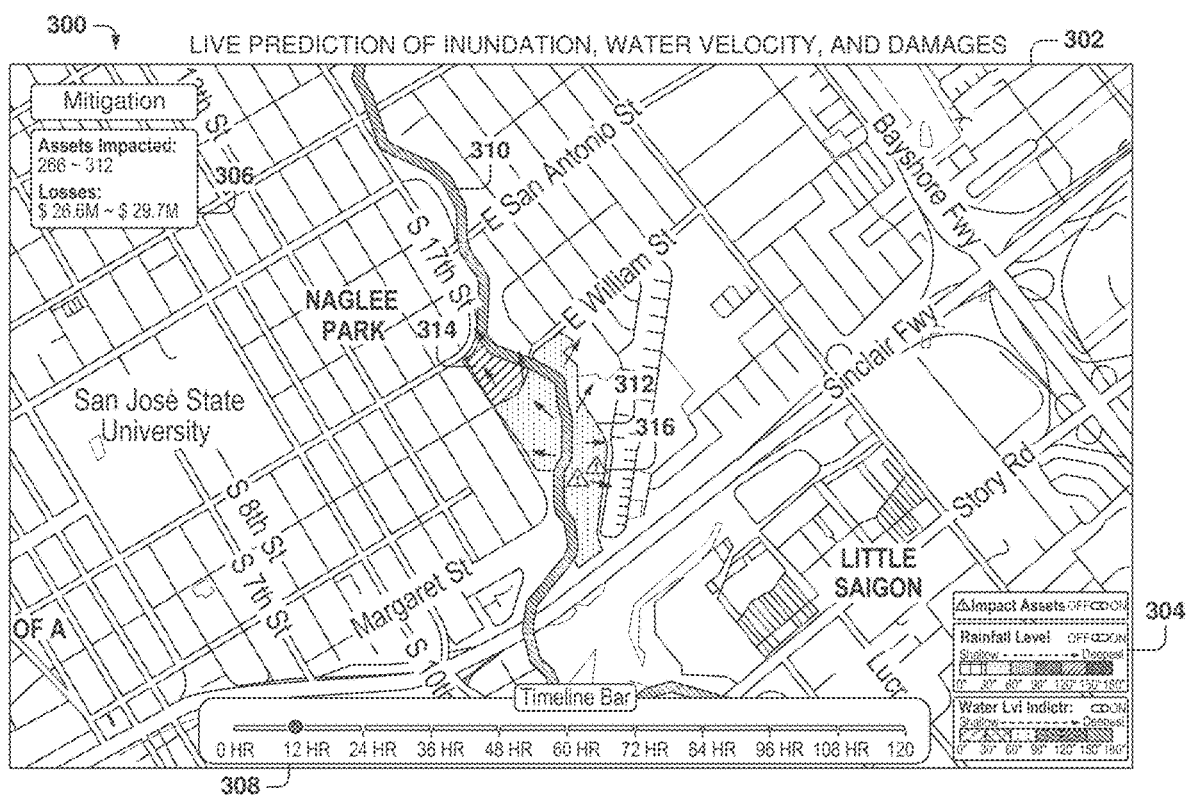
FIG. 3 is a diagram illustrating a user interface including a map for a live prediction of inundation, according to some example embodiments.

FIG. 3 is a diagram illustrating a user interface 300 including a map 302 for a live prediction of inundation, according to some example embodiments. In the map 302, areas 310, 312, and 314 are different shades of a color (e.g., blue) that represents the water, where the darker the color, the deeper the water level.

Area 310 has the darkest shade of the color, representing the river carrying the water. It is to be noted that, for simplicity of description, waterways may be referred to as rivers, but any type of channel that carries water may also be included in the definition of river, such as levees, creeks, man-made channels, etc. Areas 312 and 314 represent inundation levels, which means that the water has gone beyond the riverbed, where area 312 is darker than area 314.

The arrows in the water areas represent water-flow velocity, where the longer the arrow, the faster the water is flowing. Properties 316 impacted by the flood are represented by triangles with a "!" (exclamation mark) inside. In some example embodiments, the triangles are yellow, but other colors may also be utilized, such as red. The properties may be buildings or some other critical infrastructure.

A building has been impacted during a flood event when the elevation of the building floor is below the water level, e.g., water is coming into the building and the building is being flooded. Another factor related to floods is water velocity, because if the water has high velocity, the building may be damaged or swept away by the rushing waters.

At the bottom of the map 302, a timeline bar 308 represents how far in advance the forecast is for the map 302, where a circle (e.g., red) indicates the forecast period. In the example embodiment of FIG. 3, the forecast is for 12 hours from the current time (time zero). In one example embodiment, the timeline is for forecasting up to five days (120 hours), but other timeline periods may be utilized.

On the top left corner, a message 306 provides information about the forecast. In the example embodiment of FIG. 3, the message 306 predicts between 266 and 312 impacted assets, and losses between 26.6 and 29.7 million dollars. In other example embodiments, other informational messages may be provided.

At the bottom right corner, an input area 304 provides map options that might be selected by the user. In some example embodiments, a first option indicates whether to turn on or off the display of impacted assets. A second option provides for turning on or off the presentation of the rainfall level on the map 302. In some example embodiments, the rainfall level and the water level are measured in inches, but other units may be utilized, such as feet, millimeters, centimeters, or meters. In the example embodiment of FIG. 3, the rainfall level has been turned off. The second option includes the color indexing for showing the rainfall levels (e.g., dark blue, light blue, green, yellow, orange, and red).

A third option enables the user to turn on or off the water-level indicators (e.g., 310, 312, and 314), and a color scale indicates the water depth, from shallowest to deepest.

In some example embodiments, a predetermined threshold is defined as the minimum water level depth to consider that a location is flooded. For example, the predetermined threshold may be in the range from 1 inch to 12 inches, but other values may also be utilized.

It is to be noted that the embodiments illustrated in FIG. 3 are examples and do not describe every possible embodiment. Other embodiments may utilize different colors, different options, different locations of the information window, etc. The embodiments illustrated in FIG. 3 should therefore not be interpreted to be exclusive or limiting, but rather illustrative.

The user interface 300 provides great flexibility for managing possible flooding. The predictive capability allows the user to see how the water is expected to spread out of the waterbed. Further, a mitigation module allows the user to assess the impact on the flooding of using the mitigation measures.

Figure 4:
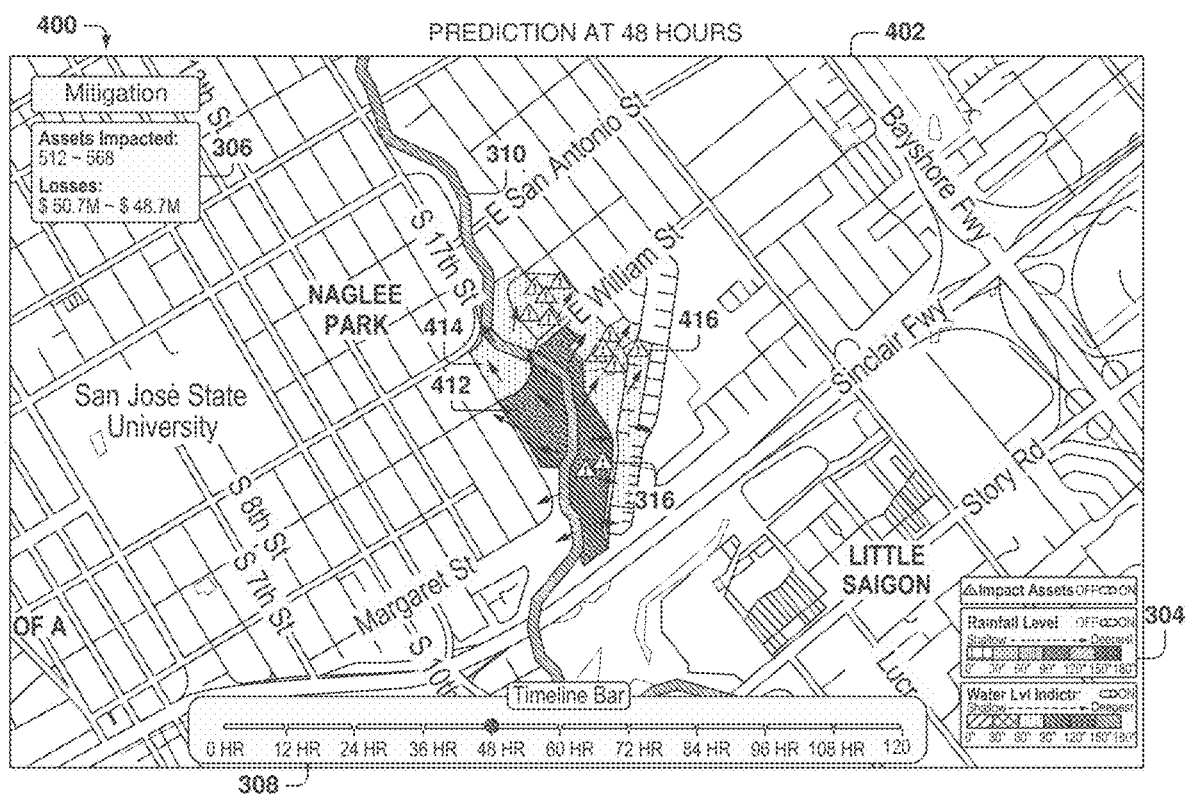
FIG. 4 shows the map for the live prediction of inundation at 48 hours, according to some example embodiments.

FIG. 4 shows a map 402 for the live prediction of inundation at 48 hours, within a user interface 400, according to some example embodiments. The map 402 shows the inundation levels predicted at 48 hours from the current time, as shown in the timeline bar 308.

As compared to the map 302 for flooding at 12 hours, the map 402 shows that the flooding has spread to areas 412 and 414. As the flooding grows, more properties 416 are shown as impacted.

It is to be noted that the flood prediction is calculated at time zero, using the information available at that time. However, as more information is made available over time, the flood prediction is adjusted to reflect the new information. For example, if flooding data is received at hour 6, the prediction is changed based on the new flooding data, for future time periods.

Figure 5:
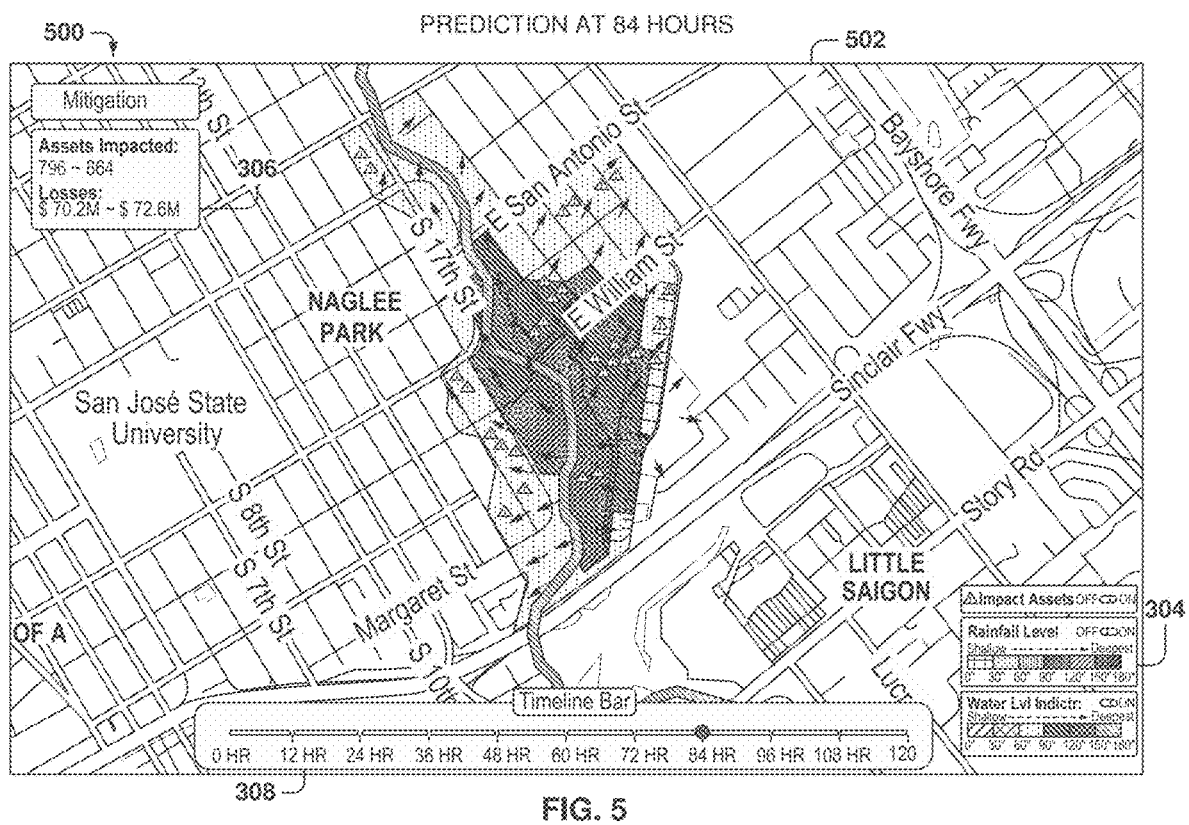
FIG. 5 shows the map for the live prediction of inundation at 84 hours, according to some example embodiments.

FIG. 5 shows a map 502 for the live prediction of inundation at 84 hours, within a user interface 500, according to some example embodiments. As seen in the user interface 500, the map 502 shows that the inundation is spreading and more assets are shown as impacted. The timeline bar 308 indicates that the prediction is for the 84-hours timeframe.

As seen in FIGS. 3-5, the live prediction of inundation, together with the water velocity and damage indicators, provides valuable information for government officials, referred to herein generally as "managers," in order to plan responses. By simply selecting a time period on the timeline bar, the manager is able to see the evolution of the inundation in the future and what critical infrastructures are affected.

Now, the manager may use the mitigation module to test how different mitigation measures may affect the inundation levels and the assets affected, as discussed below. The user interface is also very flexible by allowing different layers of information to be presented, as selected by the user. The user may select to show or hide impacted assets, rainfall levels, and water-level indicators. This way, readability may be improved by presenting only the desired information, since the maps may sometimes become too detailed and the abundance of detail may get in the way of clarity. Of course, the manager may also select to zoom in to increase the map resolution and focus in the desired areas (e.g., areas being inundated). The manager may also select to zoom out to get a view encompassing larger areas.

Figure 6:
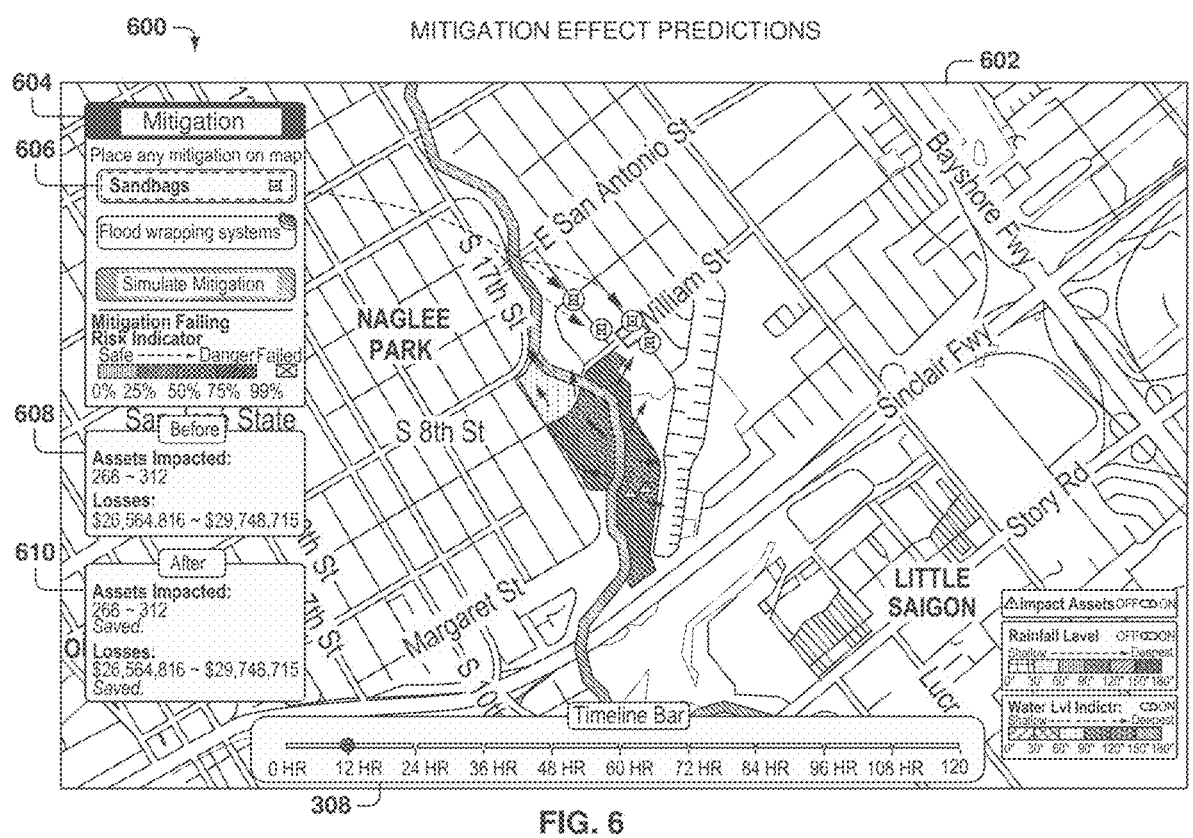
FIG. 6 is a diagram illustrating a user interface for predicting the effect of flooding mitigation measures, according to some example embodiments.

FIG. 6 is a diagram illustrating a user interface 600 for predicting the effect of flooding mitigation measures, according to some example embodiments. Within the user interface 600, the manager is provided several options to test mitigation measures. For example, the manager may be at time 12 hours and may want to know what would happen if sandbags were placed at certain locations to stop or slow down the water from inundating certain areas.

A mitigation box 604, within map 602, enables the manager to enter mitigation measures. In this case, the manager has chosen 606 to place sandbags in certain locations identified by the manager. In other embodiments, other types of mitigation measures may be utilized, such as adding flood-wrapping systems (e.g., walls to hold the advance of water), air-filled or water-filled tubes, etc. More details are provided below with reference to FIG. 14.

Once the manager finishes placing the sandbags, the manager may click on the "simulate mitigation" button to start the calculations of how the mitigation measures would affect the inundation maps.

The map includes a mitigation-failing risk indicator that is color coded. The mitigation-failing risk indicator is a number that provides a probability that the mitigation (e.g., the sandbags) will fail, or will not achieve significant results.

After the calculations, a before box 608 and an after box 610 provide details on the differences between the number of assets impacted and the monetary losses before and after the mitigation. In the exemplary embodiment of the user interface 600, there are no differences yet, since the sandbags are just being placed.

Figure 7:
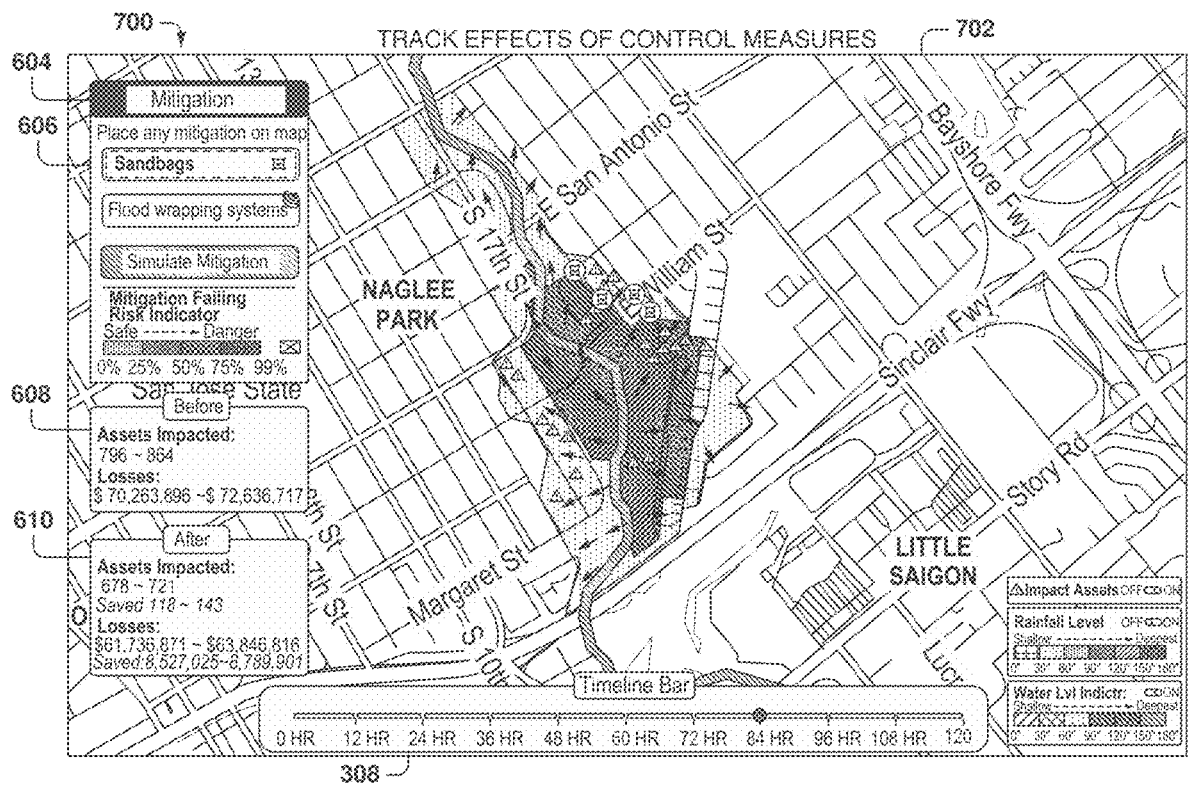
FIG. 7 shows the effects of the mitigation measures at 84 hours, according to some example embodiments.

FIG. 7 shows the effects of the mitigation measures at 84 hours, according to some example embodiments. A user interface 700 includes a map 702 showing the effects of the mitigation at 84 hours. Visually, the map 702 shows that the sandbags have slowed down the inundation and reduced the amount of area inundated at 84 hours. A comparison of the map 502 from FIG. 5, showing the inundation at 84 hours without mitigation, reveals that the sandbags have slowed down the flow of water.

In addition, the before box 610 shows that, without mitigation, the number of assets impacted would be between 796 and 864, with losses between 70.2 million and 72.6 million dollars. The after box 612 shows that the number of assets impacted has been reduced to between 678 and 721, a savings of between 118 and 143 assets. Additionally, the losses have been reduced to between 61.7 million and 63.8 million dollars, a savings of between 8.5 and 8.8 million dollars.

The manager may run several simulations to compare results. For example, if the manager has a limited amount of resources for placing sandbags, the manager may want to know what location of the sandbags would provide the biggest return. For example, the manager may decide to check what would happen if the sandbags were placed towards the south edges of the inundation area, and see how many impacted assets and how many losses could be prevented. Once the manager runs the multiple scenarios, the manager is able to make a decision and place the sandbags at the best location.

It is to be noted that the simulations may include multiple mitigation measures. For example, the manager may have a team to place sandbags and another team to place flood-wrapping systems, and the manager may also observe the benefit when the multiple measures are put in place.

Figure 8:
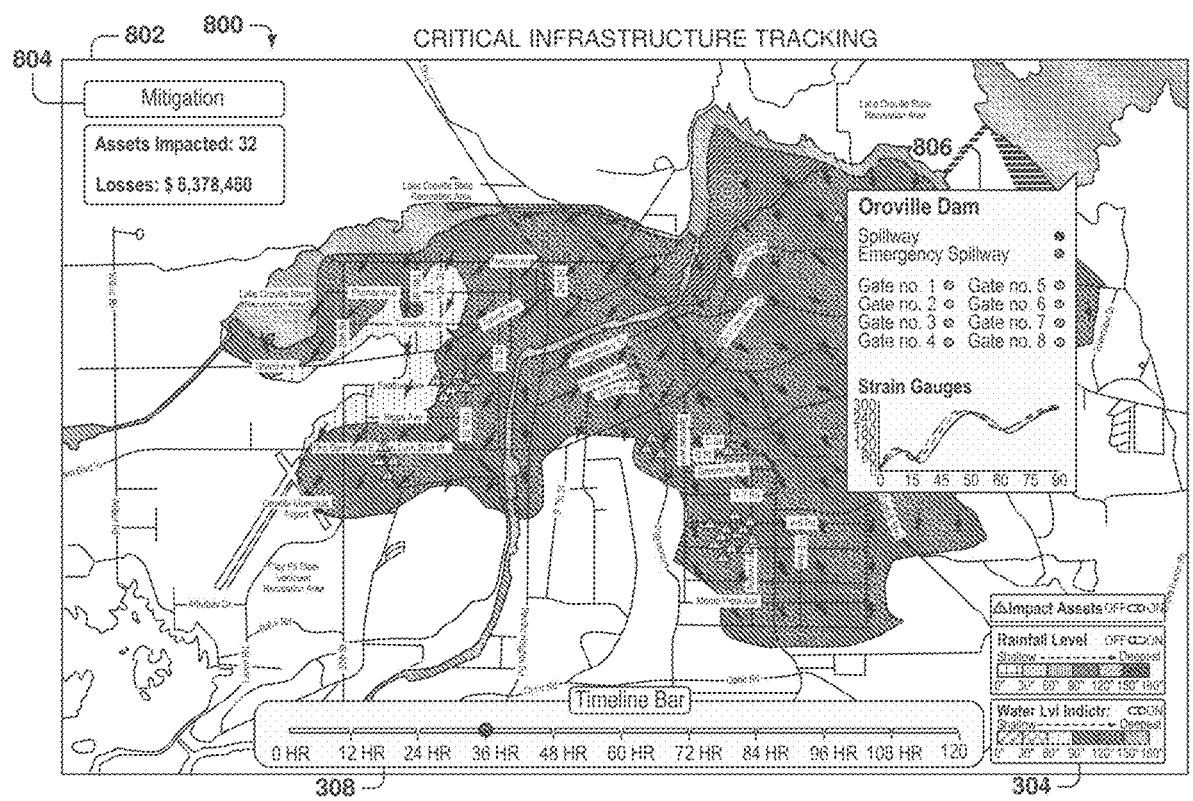
FIG. 8 is a diagram illustrating a user interface for tracking critical infrastructure, according to some example embodiments.

FIG. 8 is a diagram illustrating a user interface 800 for tracking critical infrastructure, according to some example embodiments. The user interface 800 provides options for tracking critical assets and evaluating mitigation options 804. In this example, the timeline bar 308 shows 36 hours, and map 802 shows the areas that are predicted to be inundated by that time.

In the example of FIG. 8, the Oroville Dam is tracked for potential problems. The Oroville Dam is an earth fill embankment dam on the Feather River east of the city of Oroville, Calif., in the Sierra Nevada foothills east of the Sacramento Valley. In February 2017, the main and emergency spillways failed, leading to the evacuation of 188,000 people living near the dam and causing a large amount of damages for people and businesses in the area.

The flood analysis system collects and stores information regarding critical assets, such as the type of asset, building materials, year of construction, location, known risks, and asset-specific data, such as gauge readings for the dam.

By clicking one of the assets tracked in the map 802, the manager is able to quickly gather information about the asset. In this example, when the manager selects the Oroville Dam, the user interface 800 presents an information box 806 with detailed information about the asset. In some cases, the information box 806 may include additional selectable buttons or links to obtain more information or enter a data entry screen so the manager may add additional data about the asset.

In one example embodiment, the information box 806 presents the stream gauge readings of the dam. There are eight gates to control the flow of water out of the dam and eight corresponding stream gauges. Based on the stream gauge readings, the flood analysis system creates a health indicator index for each of the gates, which is then represented as a color-coded icon next to the gate name that represents the health indicator index.

In addition, the flood analysis system may generate alerts and notifications based on the health indicator index, or based on some of the parameters identified by the manager in the system. This may be used by the manager to perform a scheduled maintenance or check for potential problems, especially ahead of incoming storms.

The information box 806 may also include a time chart indicating the strain on the gauges over time. This provides a quick representation of the evolution of the strain on the gauges that helps the manager to make decisions. In this example, it shows how the strain has been increasing over time, so remedial action should be taken.

Figure 9:
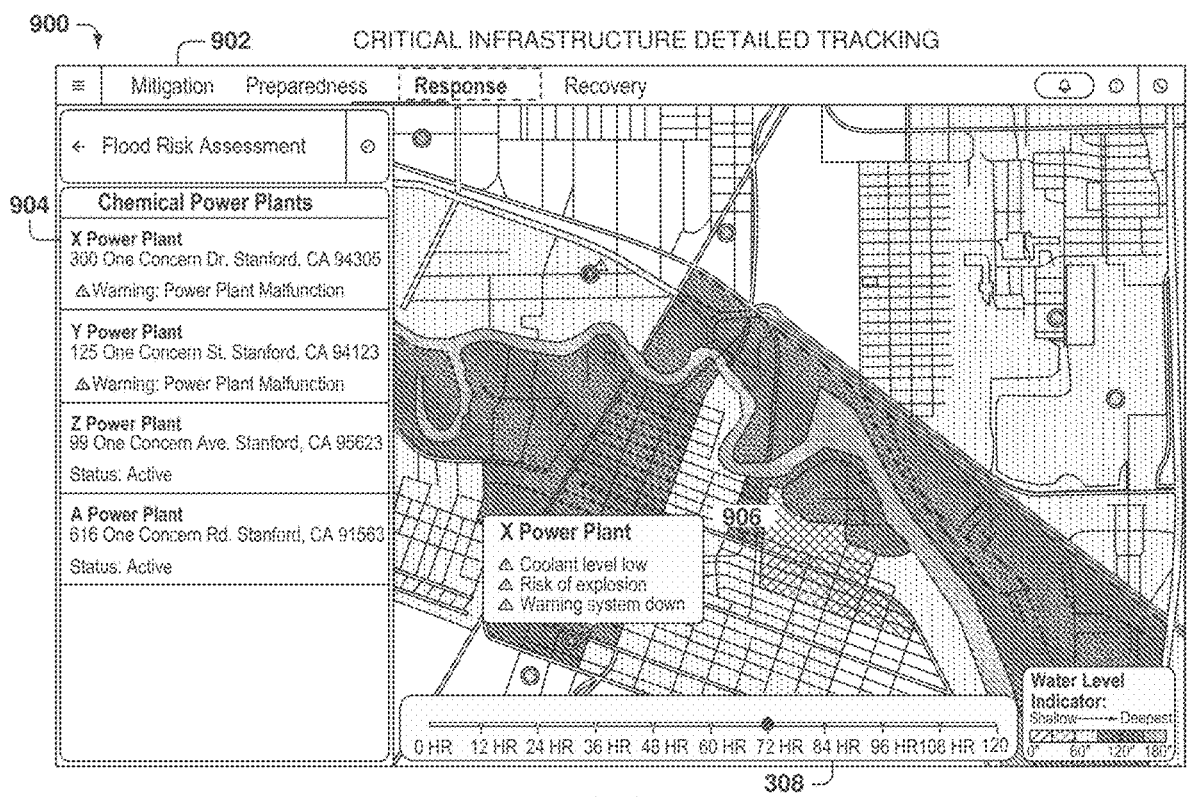
FIG. 9 shows detail for the critical infrastructure tracking, according to some example embodiments.

FIG. 9 shows detail for the critical infrastructure tracking, according to some example embodiments. A user interface 900 is another example of asset tracking, in this case for chemical and power plants. A map 902 shows the inundation levels in the area around X power plant. An information box 906 shows several alarms for the X power plant, including "coolant level low," "risk of explosion," and "warning system down." It is to be noted that this prediction is for the 72th hour, so the manager may be able to take mitigation actions to lower the risk.

Additionally, an information box 904 on the left part of the map 902 shows a list of chemical power plants in the area, including the X power plant. Brief information is given for each of the power plants, such as address and status or alarms. By clicking or selecting any of the power plants, the manager may cause additional information to be presented on the maps, as illustrated by the information box 906 for the X power plant.

Figure 10:
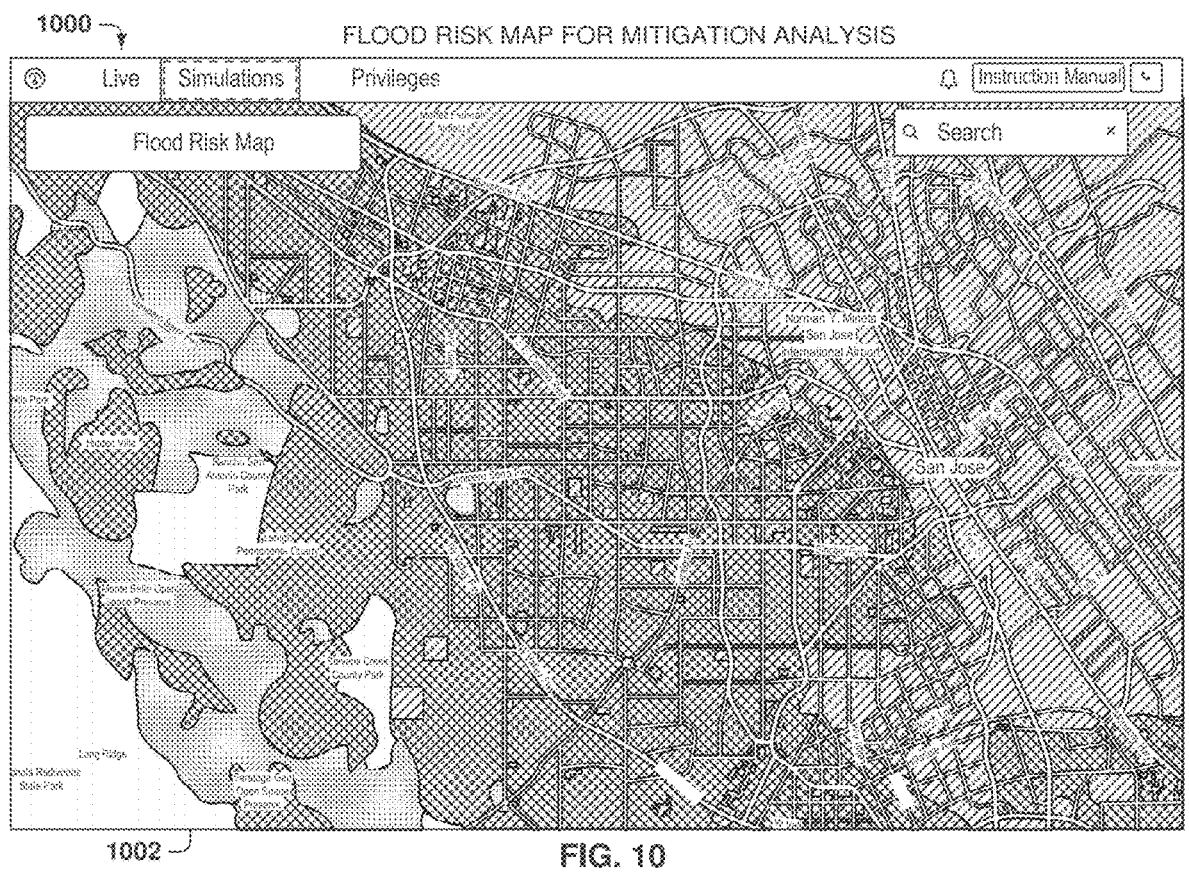
FIG. 10 is a diagram illustrating a user interface for a flood-risk map simulation, according to some example embodiments.

FIG. 10 is a diagram illustrating a user interface 1000 for a flood-risk map 1002 simulation, according to some example embodiments. The user interface 1000 is for the simulations module that calculates the flood-risk map. The flood-risk map 1002 provides a color-coded risk indicator for a scenario identified for the simulation. The result of the simulation shows that the risk level is higher on the top right corner of the map than it is towards the middle of the map.

The manager may zoom in on the desired area to get further details on the risk, such as at the block level.

The simulation may take into account different inputs and use different models, such as a model that predicts risk based on climate change. The flood-risk map 1002 predicts what may happen in the future when storms happen in the area by showing the inundation areas, up to block-by-block-resolution inundation maps, which include water levels, water depth at each location, and water velocity (including direction and actual flow speed).

The simulation may be run under different conditions, and results of multiple simulations may be combined into one single flood-risk map. Thus, many simulations may be performed under many different conditions (e.g., hundreds of different weather patterns) and also on historical data, accounting for climate change.

By taking into consideration climate change, it is possible to analyze for future weather patterns that will be different from historical weather patterns. The inputs may include spatial maps over time steps under different weather conditions, high-resolution rainfall maps, wind-fields data, relative humidity, and incoming shortwave and longwave radiation.

In some cases, the manager may also define one or more weather patterns and then run the simulations to create the flood-risk map.

Figure 11:
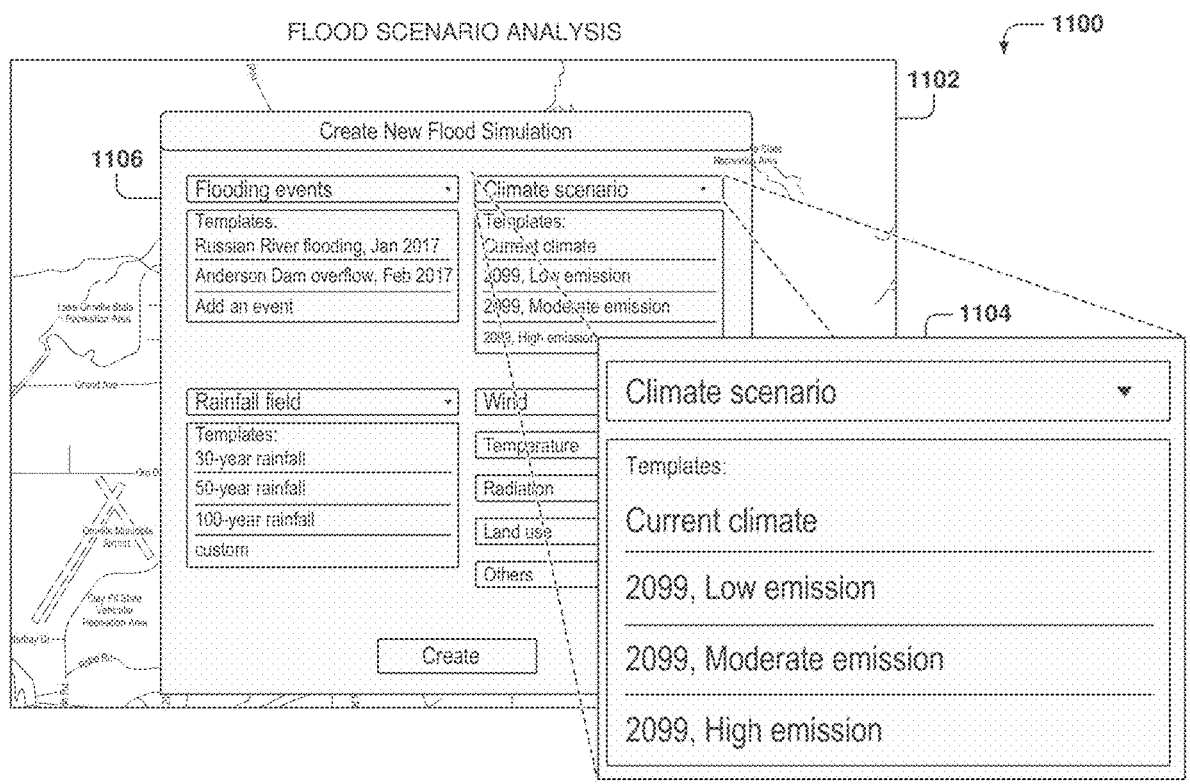
FIG. 11 is a diagram illustrating a user interface for entering parameters defining a flood scenario analysis, according to some example embodiments.

FIG. 11 is a diagram illustrating a user interface 1100 for entering parameters defining a flood scenario analysis, according to some example embodiments. The user interface 1100 allows the manager to choose a weather scenario for calculating the flood risk map. The weather scenario defines the conditions for calculating water-depth values in the region. The weather scenario may be defined by selecting previous flooding events that occurred in the past, different climate scenarios, rainfall fields, wind, temperature, radiation, land-use, and other miscellaneous data. For advanced users, it is also possible to enter detailed weather information to further define the weather scenario.

A flood input interface 1106, including map 1102, provides different options for setting up the one or more flood simulations to be used under the selected weather scenario. Flooding events, rainfall fields, and climate scenarios may utilize data (e.g., a rainfall map) from past flooding events.

A climate scenario option 1104 provides different predefined templates for selecting the overall climate scenario. The climate scenario takes into account climate change, so the simulation will be for an event that is happening in the future, which may be different from an event that may happen today under different climate parameters. For example, the templates include a template for the current climate, and templates for low, moderate, and high emissions. The "2099, low emission" scenario is a climate projection for the $21^{st}$ century, year 2099, under a low emissions scenario.

The flooding events option provides templates for past inundations, such as the Russian River flooding in January 2017, or the Anderson Dam overflow in February 2017.

The rainfall field option includes a template for selecting 30-, 50-, or 100-year events, but other embodiments may include different time frames. A 100-year event is a catastrophic event that happens statistically every 100 years. For a given area, the event may not have happened yet, but it may happen within the next 100 years. For example, an area that has never flooded may be flooded under a catastrophic 100-year event.

Figure 12:
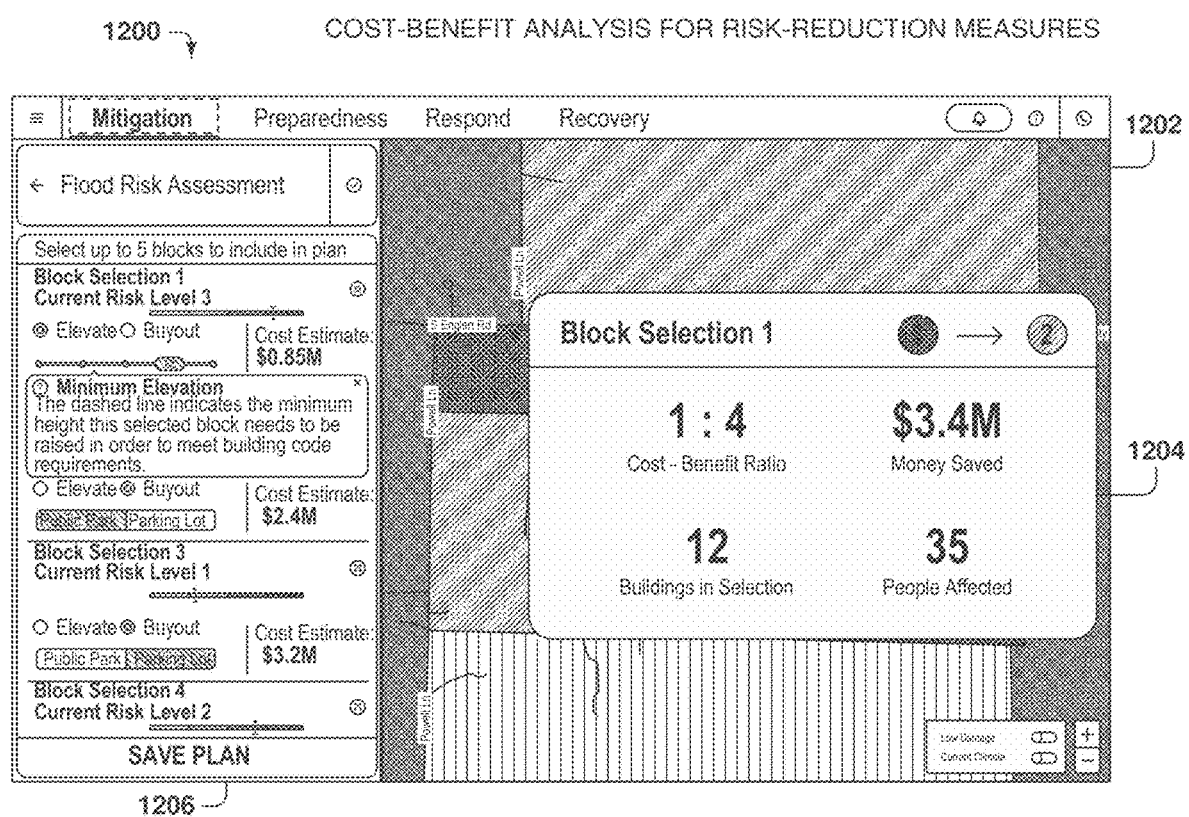
FIG. 12 is a diagram illustrating a user interface for a cost-benefit analysis for risk-reduction measures, according to some example embodiments.

FIG. 12 is a diagram illustrating a user interface 1200 for a cost-benefit analysis for risk-reduction measures, according to some example embodiments. The user interface 1200 shows the mitigation module for performing the cost-benefit analysis of potential mitigation measures. Each polygon in a map 1202 represents a block, and the blocks are color-coded (as represented by the different shadings) in the map 1202 to represent different levels of damage.

The user interface 1200 includes an input area 1206 for entering data for a mitigation plan. In one example embodiment, the mitigation plan prompts the user to select up to five different blocks for inclusion in the plan, although other embodiments may allow for a different number of blocks or let the user select the number of blocks in the plan. A "save plan" option lets the user save the plan in permanent storage.

After the simulation is done to calculate damage levels, the blocks are colored according to their damage levels. If the user selects a block, additional information is provided. In the example of FIG. 12, the user has selected (e.g., by clicking on the block in the map 1202) block 1. An information box 1204 is presented with information about the block, such as the cost-benefit ratio (e.g., 1:4), the number of buildings in the block (e.g., 12), the amount of money saved in flood damages because of the mitigation measures (e.g., 3.4 million dollars), and the number of people affected in the block (e.g., 35).

In addition, color-coded icons on the top right corner of the information box 1204 illustrate that the risk level has decreased from risk level 3 to risk level 2. By elevating the block five feet, the manager decreases the risk from level 3 to level 2. The risk level, also referred to as the "community rating score," is defined by FEMA, with level 1 being the lowest risk and level 9 being the highest risk. Lower risk levels allow building owners to get flood insurance at lower cost than business owners of buildings with higher risk levels.

Additionally, information is provided on the input area 1206 about the block. In this example, the input area 1206 shows that the current risk level for block 1 is 3. Additionally, the user interface 1200 allows the user to select a mitigation measure of elevating the block by jacking up buildings, or a buyout option by the city to buy the structures in the block and convert them to another use. In this case, the manager has selected the "elevate" option, with an estimated cost of 0.85 million dollars.

An information message informs the user that a dashed line indicates the minimum height this selected block needs to be raised in order to meet building code requirements. A graphical scale represents the height (e.g., 5 ft). In some cases, FEMA issues regulations indicating minimum requirements for how much the buildings have to be raised in an area to reduce flood risk. If that requirement exists for the particular block, a message will let the manager know about FEMA's requirements.

The manager may also select whether to dedicate the block to a public park or use it as a parking lot, with a cost estimate of 2.4 million dollars. Additionally, other possible uses and information may also be provided for the block.

In some example embodiments, the manager may create several plans and then perform the mitigation simulations. In another screen (not shown), the flood analysis system provides comparison information for the different plans to assist the manager in making decisions for mitigating flood risk.

Figure 13:
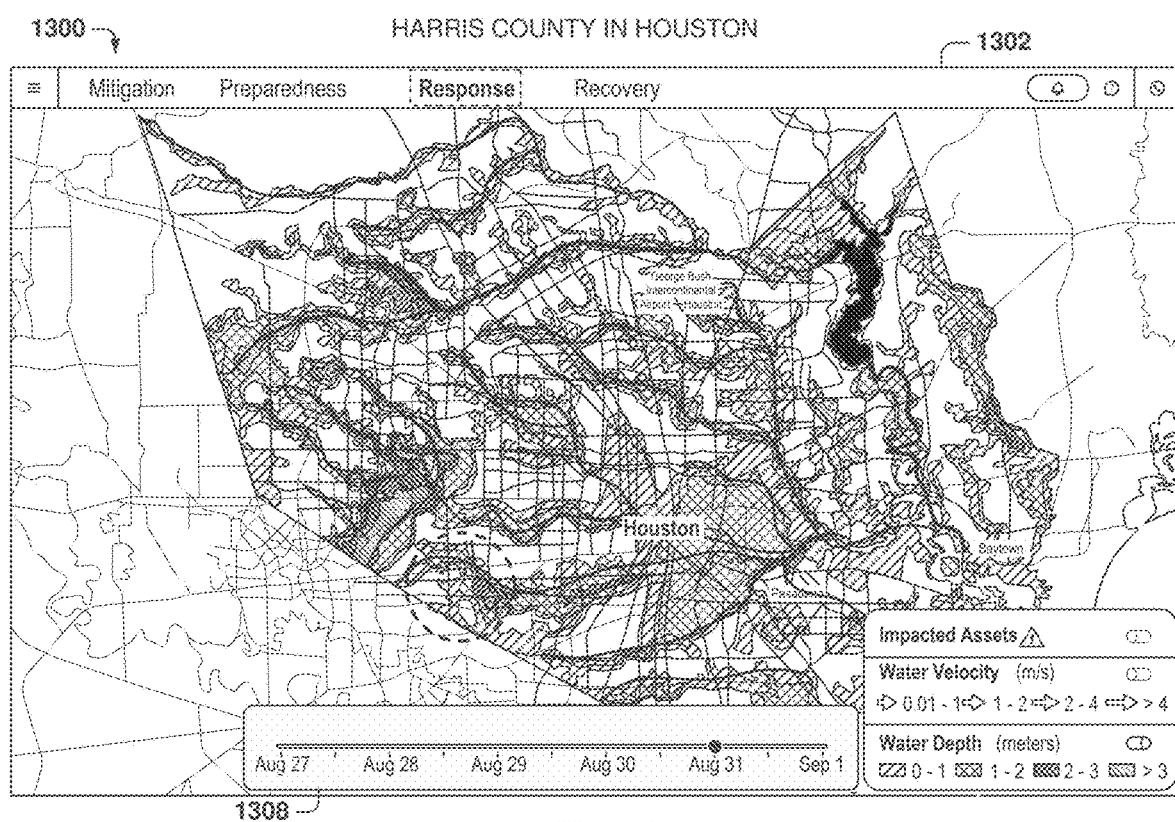
FIG. 13 is a diagram illustrating a user interface for flood analysis in the area of Harris County in Houston, according to some example embodiments.

FIG. 13 is a diagram illustrating a user interface 1300 for flood analysis in the area of Harris County in Houston, according to some example embodiments. On August 27, Harris County in Houston, Tex., was flooded when hurricane Harvey dumped a large amount of rain in the area. The user interface 1300 shows an inundation map 1302 showing a simulation of the damage as if it were performed on Aug. 27, 2017, as indicated in the timeline bar 1308, which also indicates that the inundation map 1302 is for Aug. 31, 2017. The different color areas, as indicated by the different shadings, show the water depth in the different blocks. The darker lines show the waterways, and the colors in the map indicate the water depth.

As shown in this simulation used for illustration purposes, if the flood analysis tool had been available on Aug. 27, 2017, a manager may have been able to forecast the flood damage and provide mitigation measures to reduce flooding or work with affected neighborhoods to plan for the safety of residents.

Figure 14:
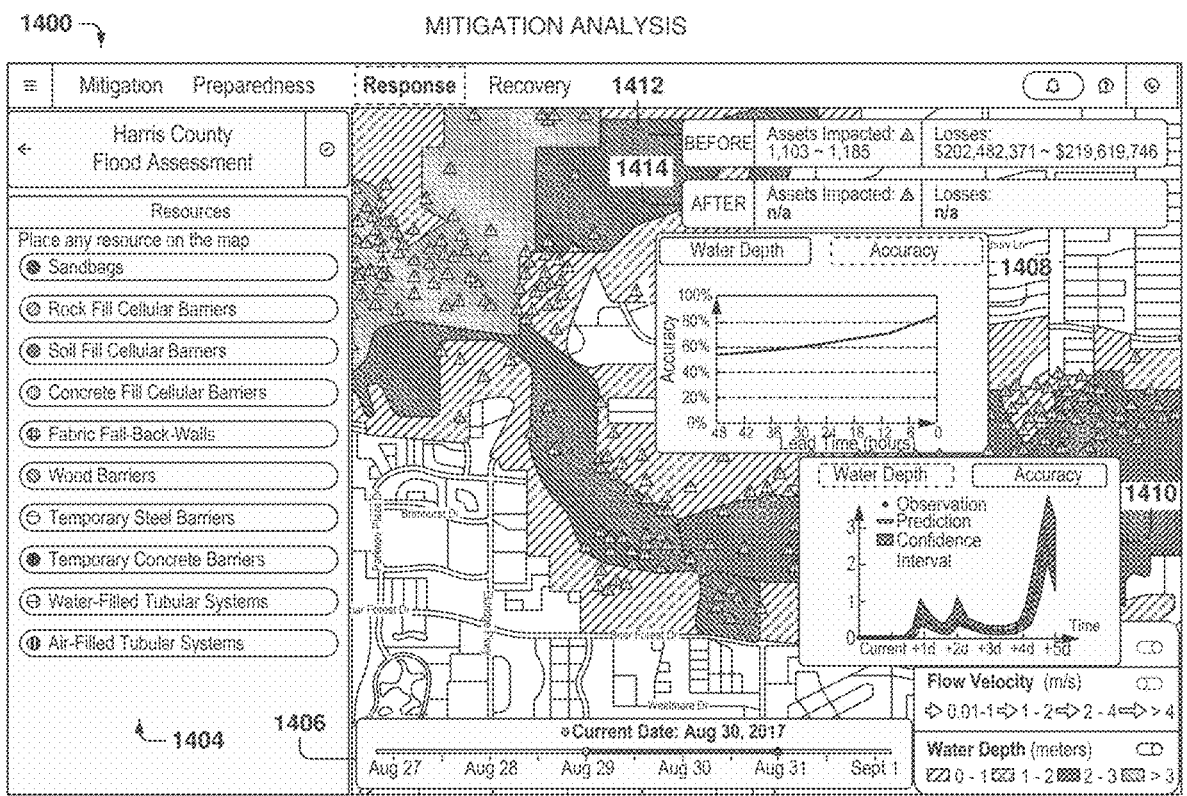
FIG. 14 is a diagram illustrating a user interface for mitigation analysis, according to some example embodiments.

FIG. 14 is a diagram illustrating a user interface 1400 for mitigation analysis, according to some example embodiments. The user interface 1400 provides options for configuring mitigation measures, and the option selected is "Response" in the top selection menu of the user interface 1400. This means that the manager is able to enter one or more responses to the predicted inundation.

A time bar 1406 indicates that the current date in this example is Aug. 30, 2017, and the simulation started on Aug. 27, 2017. A map 1402 is for the simulation performed on Aug. 29, 2017, which means that as more data becomes available, the simulation is updated to account for the new data. The new data may include many types of weather and situation data, such as updated weather maps, updated screen gauge readings, satellite imagery, reports from people on the field, news, social media, etc. As the new data comes in, the simulation is updated, including updating the map 1402.

The inundation map is for the inundation levels on Aug. 31, 2017. Therefore, the map 1402 shows the effect on the inundation levels after the mitigation measures are put in place.

On the left side of the user interface 1400, a resource menu 1404 is presented to the user, where the user may select from multiple mitigation resources. In some example embodiments, the mitigation resources include sandbags, rock fill cellular barriers, soil fill cellular barriers, concrete fill cellular barriers, fabric fall-back-walls, wood barriers, temporary steel barriers, temporary concrete barriers, water-filled tubular systems, and air-filled tubular systems. This is not meant to be an exhaustive list, and, in general, the mitigation measures may include different barriers of different materials and different shapes.

Once the manager selects one of the options, the manager may select where to place the water barrier. In one example embodiment, the manager may place a mouse pointer on the desired location and click the mouse. In other example embodiments, a touchscreen may be used and the water barriers may be placed by touching the desired place on the map 1402.

In the map 1402, the user has turned on the impacted-assets layer, and the map 1402 shows a large number of impacted assets. The manager may select any of the assets and obtain additional information. In the example of FIG. 14, two different charts 1408, 1410 are presented for two different assets, as examples of some of the different types of available information.

The chart 1408 shows the accuracy over time as a function of the lead time in hours. The chart 1410 shows the predicted time series of water level at the selected location as a function of time. As used herein, time series refers to a set of data points indexed over time. For example, the time series for water depth at a given location includes the water depth at the location for a plurality of times. The chart 1410 shows the observed values, the predicted values, and the confidence interval. It is to be noted that some of the observed values may be missing, since there may not be readings available for some periods of time. Different locations may have different curves for the forecasted time series, and may also have different accuracy charts.

An information box 1412 provides information about the damage before implementing the mitigation measures, and an information box 1414 provides information about the damage after implementing the mitigation measures. In this example, the values for the information box 1414 are not presented because the simulation for the new mitigation measures has not been run yet.

Figure 15:
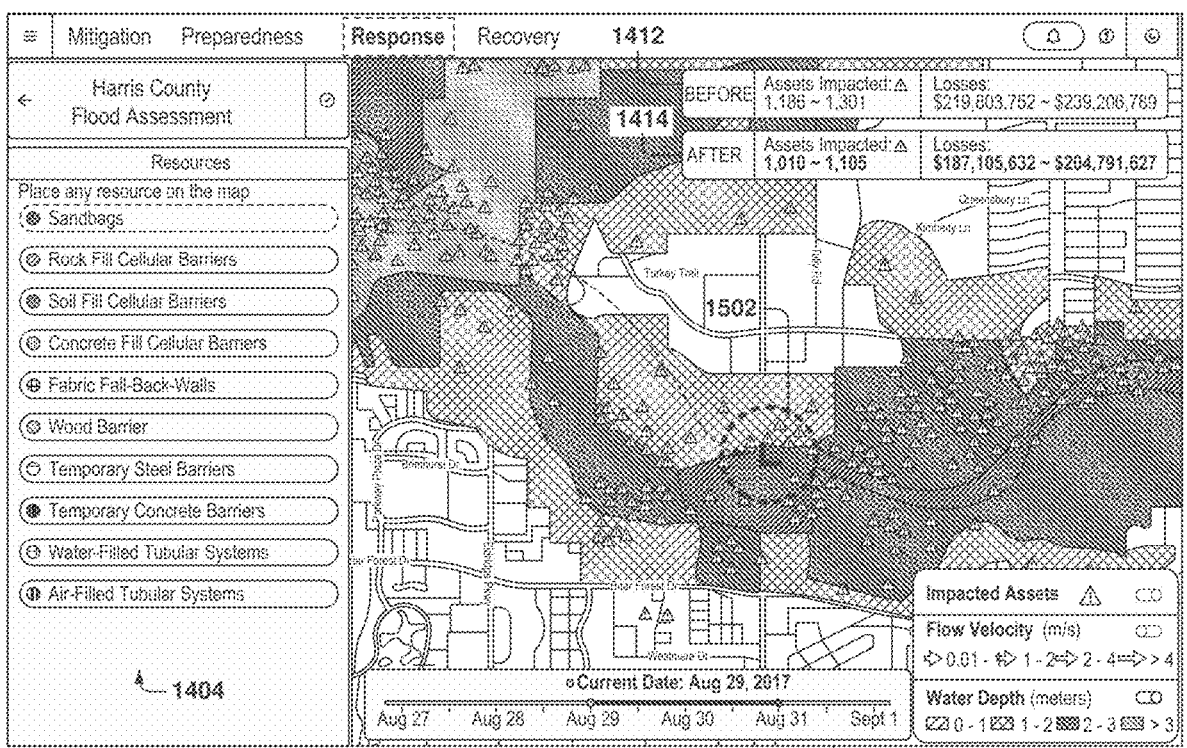
FIG. 15 shows the effects of the selected mitigation measures, according to some example embodiments.

FIG. 15 shows the effects of the selected mitigation measures, according to some example embodiments. In this example, the user has selected to place sandbags on the resource menu 1404. The sandbags have been placed at a location 1502, circled on the map 1402 for emphasis.

Once the simulation is run after the sandbags have been placed, the information boxes 1412 and 1414 show the effect of placing the sandbags. The assets impacted have been reduced to a range of 1010-1105 from a range of 1186-1301. Additionally, the monetary losses have been reduced to the range of $187.1-204.8 million from a range of $219.8-239.2 million.

Figure 16:
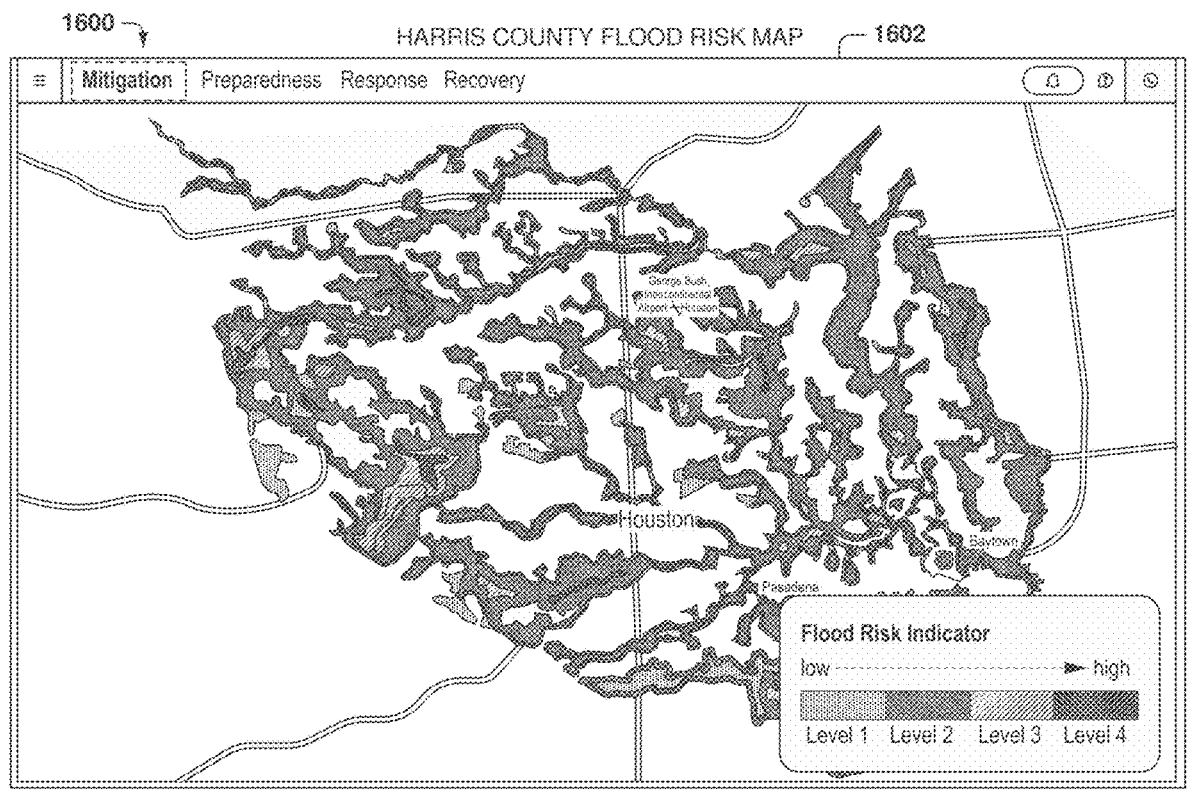
FIG. 16 is a diagram illustrating a user interface with a flood-risk map for Harris County, according to some example embodiments.

FIG. 16 is a diagram illustrating a user interface 1600 with a flood-risk map 1602 for Harris County, according to some example embodiments. In some example embodiments, the flood-risk map 1602 is created by running a number of simulations based on possible future weather patterns. In some example embodiments, hundreds of simulations may be performed under different weather scenarios. Therefore, the flood-risk map 1602 is not representing just one event, but representing a probabilistic distribution across many possible events.

The flood risk map 1602 represents the probabilities that locations in the map will be inundated within a certain period (e.g., within the next 10 years, within the next 50 years, within the next 100 years). In some example embodiments, the time period is in the range from 10 to 100 years, but other time periods may also be utilized. The risk is color coded according to the risk level. In some example embodiments, different risk-level categories are defined, and each risk category is assigned a specific color. In the example embodiment of FIG. 16, four risk categories have been identified: levels 1-4. The risk level is determined based on the frequency of flooding that happened in the past and the frequency of flooding estimated for the future (e.g., for a period of 30, 50, or 100 years).

By running multiple weather scenarios, the flood analysis system provides a better representation of possible flood damages, allowing flood managers to make plans to mitigate inundation damages. The results are more accurate than those of other approaches, such as the flood-risk maps provided by FEMA.

FEMA takes into account past flooding events, instead of future flooding events, which may be different because of climate change. In addition, FEMA may assume that, when it rains, it rains equally over the entire region, without taking into consideration the local topology.

On the other hand, the simulations generated by the flood analysis system take into account different weather patterns and the local topology, as described in more detail below with reference to FIGS. 19-31.

Figure 17:
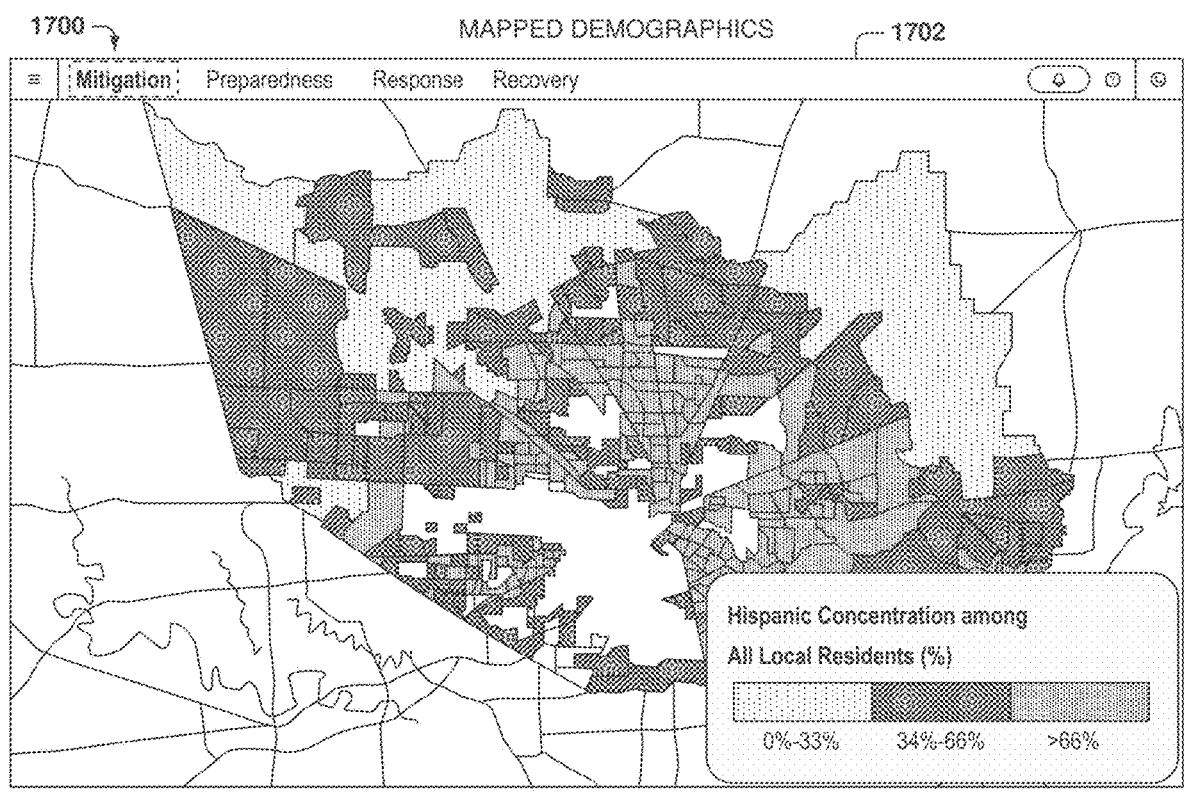
FIG. 17 is a diagram illustrating a user interface for generating demographics-based maps, according to some example embodiments.

FIG. 17 is a diagram illustrating a user interface 1700 for generating demographics-based maps, according to some example embodiments. In some example embodiments, a map 1702 provides demographic information to assist the city planners, or city managers, in the management of mitigation measures. In some cases, city planners may be accused of favoring one race over another or neglecting certain demographics. By understanding the distribution of demographics in the area, the city managers have tools to assist them in making sure that money spent on mitigation measures is evenly distributed across demographics, thus avoiding the appearance of possible favoritism of one demographic or neglecting another demographic.

In the example of FIG. 17, the map 1702 is a color-coded map for Hispanic concentration among the local residents. In this example embodiment, three different bands have been defined for the density of Hispanics in the area. In other example embodiments other types of demographics may be utilized, such as family income, age, etc.

Figure 18:
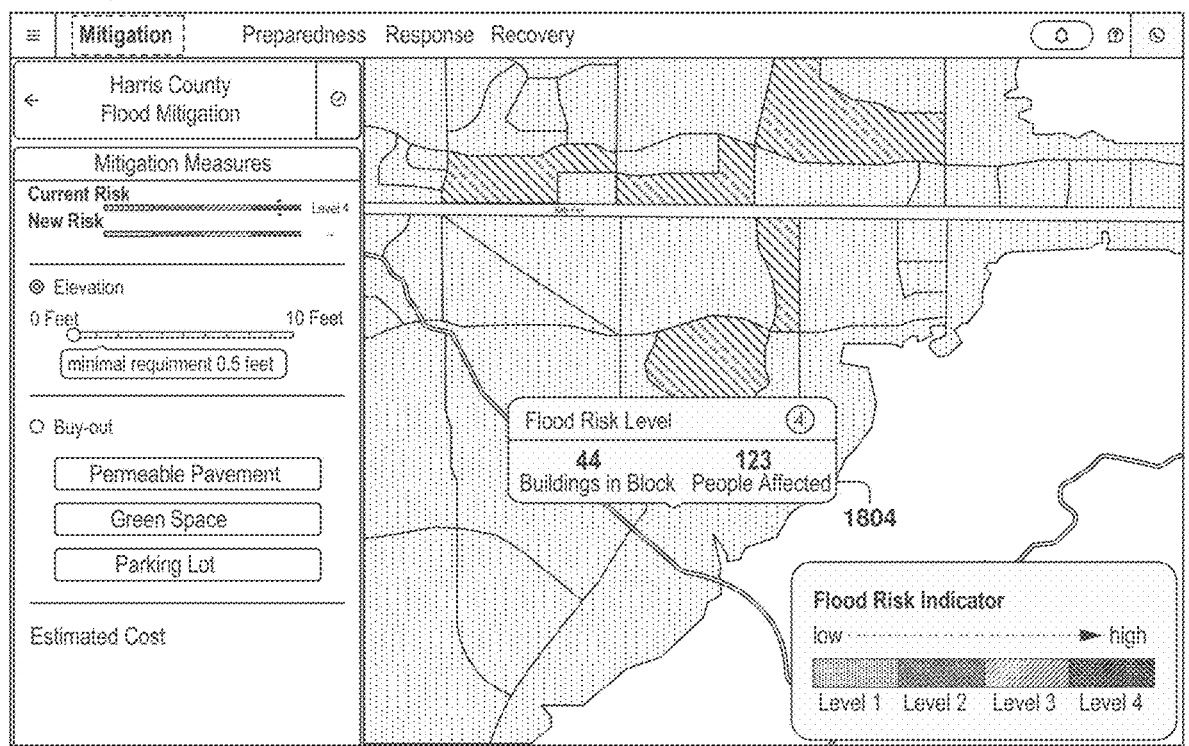
FIG. 18 illustrates a benefit analysis for mitigation measures, according to some example embodiments.

FIG. 18 illustrates a benefit analysis for mitigation measures, according to some example embodiments. A user interface 1800 includes an input area 1806 for selecting mitigation measures when planning to reduce the flood risk. For example, the manager may choose between elevating a building or buying out the building and converting the building to a different use, such as a green space or a parking lot, or converting the ground coverage to permeable pavement.

In the input area 1806, two risk scales are presented, one for the current risk level and the second one for the risk level if the mitigation measure is put in place. Further, an information box 1804, shown in a map 1802, provides information about the selected block, such as the current risk level, the number of buildings in the block, and the number of people affected.

Once the manager selects the mitigation measure and runs the simulation, the flood analysis system provides estimates for the cost and the benefit. The flood analysis system keeps track of geographic building costs for different types of construction and remedial measures in order to provide the estimates.

To calculate the benefit, the flood analysis system determines the difference in damages with and without the mitigation measures. If the estimated damage with the new measure in place is zero, the benefit will be equal to the estimated damage for flooding at the current risk level.

In some example embodiments, the damage is calculated as the predicted damage within a predetermined time period in the future. For example, the damage estimate may be for the expected damage due to flooding within the next 10 years, but other time intervals may also be utilized (e.g., 15, 20, 30, 50 years, etc.).

In other example embodiments, the manager is given the option to enter estimates for the cost and the benefits, or to modify the estimates provided by the flood analysis system.

Figure 19:
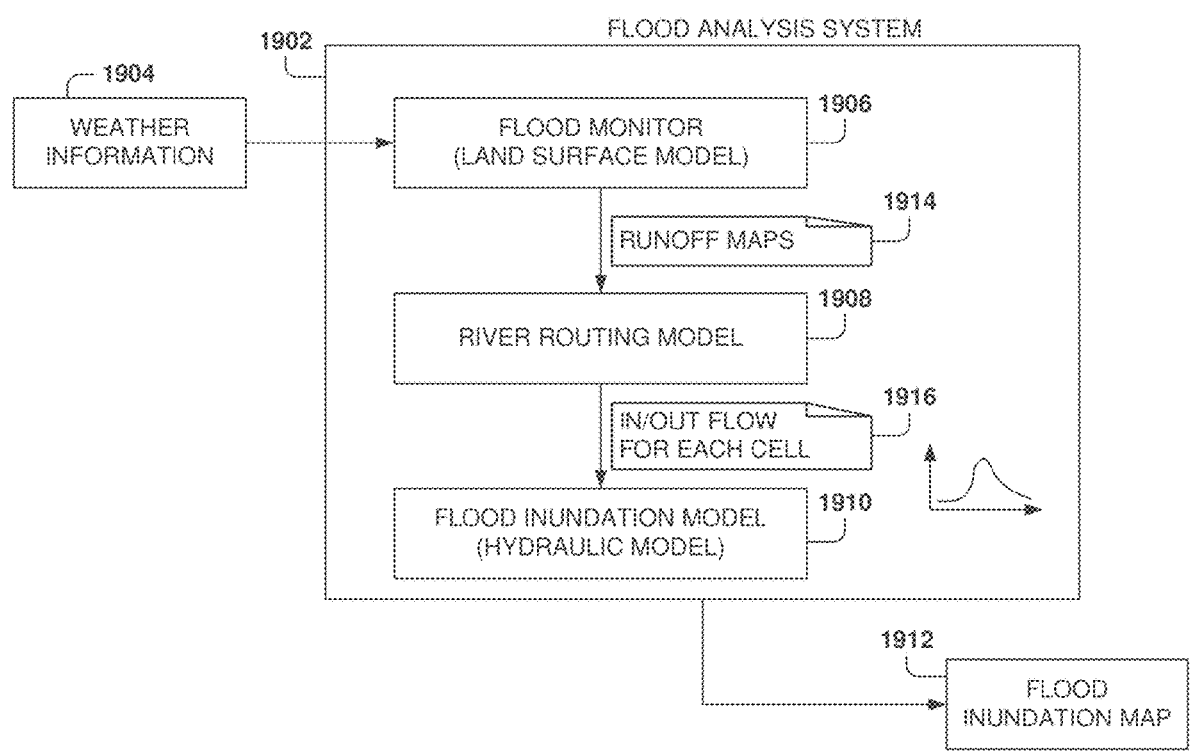
FIG. 19 is a simplified schematic diagram of the flood analysis system, according to some example embodiments.

FIG. 19 is a simplified schematic diagram of the flood analysis system, according to some example embodiments. FIG. 19 illustrates the model for the architecture of a flood analysis system 1902.

In some example embodiments, the flood analysis system 1902 takes as input weather information 1904 and outputs one or more flood inundation maps 1912. The weather information 1904 may include one or more detailed weather maps for the region of interest, or any other type of weather data.

The flood analysis system 1902 includes one or more databases (not shown) that store historical data, geographic data, and results from previous simulations. The historical data may include weather patterns, rainfall averages, rainfall data for certain catastrophic events, satellite imagery, etc.

The flood analysis system 1902 includes a flood monitor 1906 (also referred to herein as the land surface model), a river routing model 1908, and a flood inundation model 1910 (also referred to herein as the hydraulic model).

The flood monitor 1906 is used to create inundation runoff data, also referred to herein as runoff maps 1914, and the river routing model 1908 predicts the flow 1916 for each grid cell, which is the amount of water that moves through a river channel or some other waterway. The runoff maps detail the amount of free-running water on the surface. The hydrological model 210 of FIG. 2 includes the flood monitor 1906 and the river routing model 1908.

In previous solutions, hydraulic models are used to determine the flood inundation maps, which are calculated based on historical statistical data. For example, the 100-year map would show the inundation for a flood event that happens once in 100 years. On the other hand, the flood analysis system 1902 takes into account not only the historical and statistical data, but also the weather information 1904 to calculate the inundation maps. Thus, the flood analysis system 1902 predicts inundation not just based on past data, but also based on the future-weather information for an incoming storm. More details for the flood monitor 1906 are provided below with reference to FIG. 20, and more details for the river routing model 1908 are provided below with reference to FIG. 21.

After the hydrological model calculates the discharge/streamflow map, the hydraulic model 1910 is used to determine detailed inundation maps by taking into consideration the flow of water over the surface, as described in more detail below with reference to FIGS. 22-23.

Figure 20:
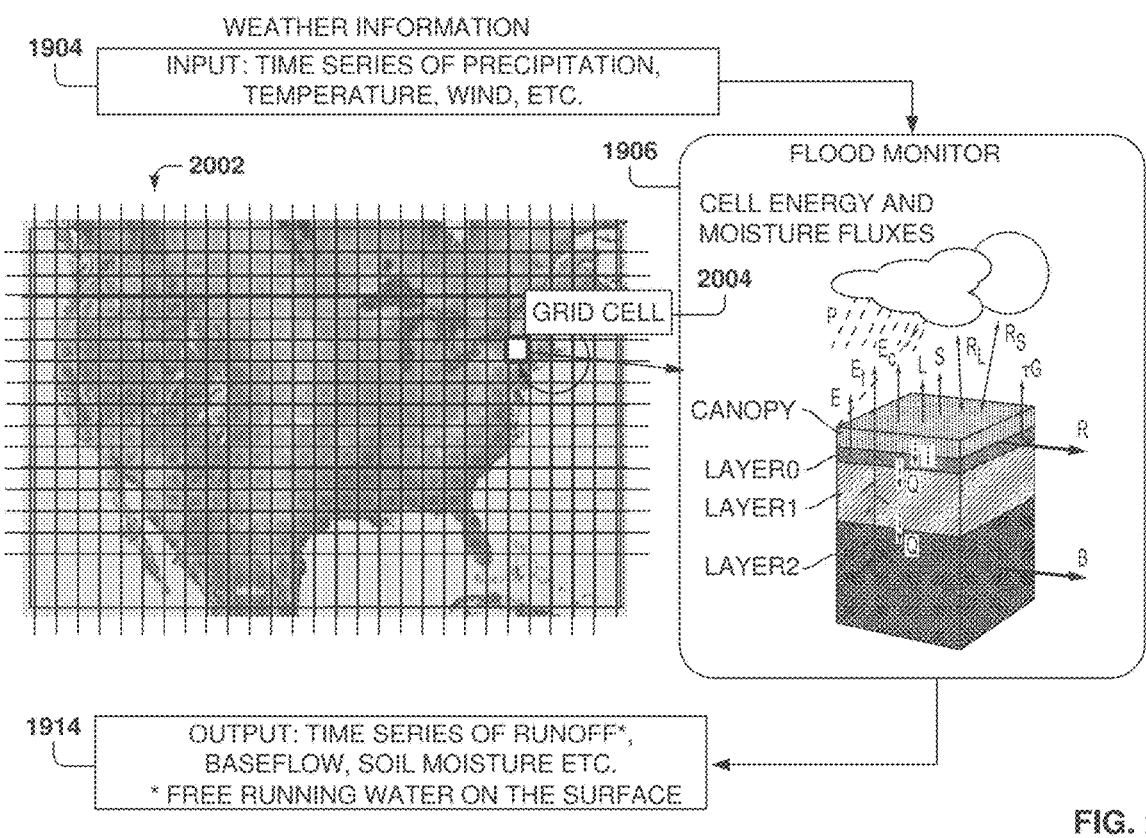
FIG. 20 illustrates functions of a flood monitor, according to some example embodiments.

FIG. 20 illustrates the functions of the flood monitor 1906, according to some example embodiments. The flood monitor 1906 ingests the weather information 1904, which includes spatial maps of precipitation, temperature, wind, and other weather data. In some example embodiments, the input is obtained from the National Weather Service, but other sources are also possible.

In some example embodiments, a map 2002 is divided geographically into grid cells and the weather data is provided for the different grid cells 2004. In some example embodiments, each grid cell 2004 has a dimension of 6 km×6 km, but other sizes for the grid cells 2004 are also possible.

The flood monitor 1906 simulates what happens on the land surface, including determining the energy and moisture fluxes. The flood monitor 1906 then generates the inundation runoff maps 1914, which represent the amount of freely running water on the surface. The amount of water running on the surface depends on the amount of rain falling on the grid cell and how much water stays on the surface, as some of the water may infiltrate into the land.

The inundation runoff maps 1914 may be encoded into time series of the runoff, baseflow, soil moisture, and other variables. The inundation runoff maps 1914 include a map which is divided into grid cells corresponding to the same grid cells as the input weather data. Therefore, at this point the resolution is the resolution of the grid cell, and the time series output is available for each grid cell. The inundation runoff maps 1914 are then fed into the river routing model 1908.

Figure 21:
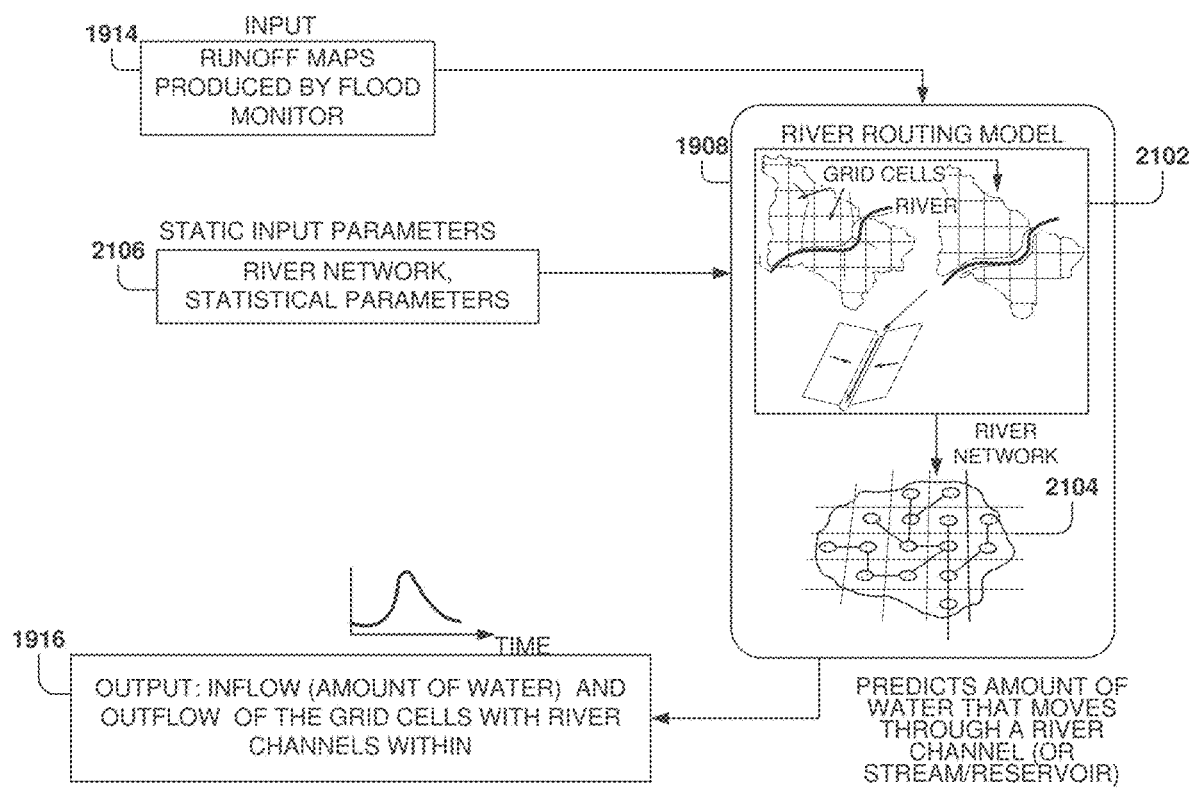
FIG. 21 illustrates functions of a river routing model, according to some example embodiments.

FIG. 21 illustrates the functions of the river routing model 1908, according to some example embodiments. The river routing model 1908 receives the inundation runoff maps 1914 produced by the flood monitor 1906, and also utilizes the river network statistical parameters 2106, which are static input parameters. The river routing model 1908 uses the inundation runoff maps 1914 to determine how much water aggregates in the river at different locations. As used herein, "river" is a generic term for any waterway, which may include rivers or man-made water channels.

The free-running waters eventually reach the river, and if the amount of water that reaches the river exceeds the river capacity, then flooding takes place.

The river routing model 1908 utilizes a spatial map 2102, which is a grid cell-based runoff map. The river routing model 1908 determines how much water is at each location over time.

Based on the inundation runoff map 1914 and the spatial map 2102, the river network 2104 is generated with a time series of how much water is running as a function of time for each of the locations (e.g., grid cells) in the river channel.

The river routing model 1908 generates the flow 1916 for each grid cell, which includes the inflow and outflow of the grid cells, where the inflow and outflow refer to the amount of water that comes in or comes out of the grid cell, respectively.

Figure 22:
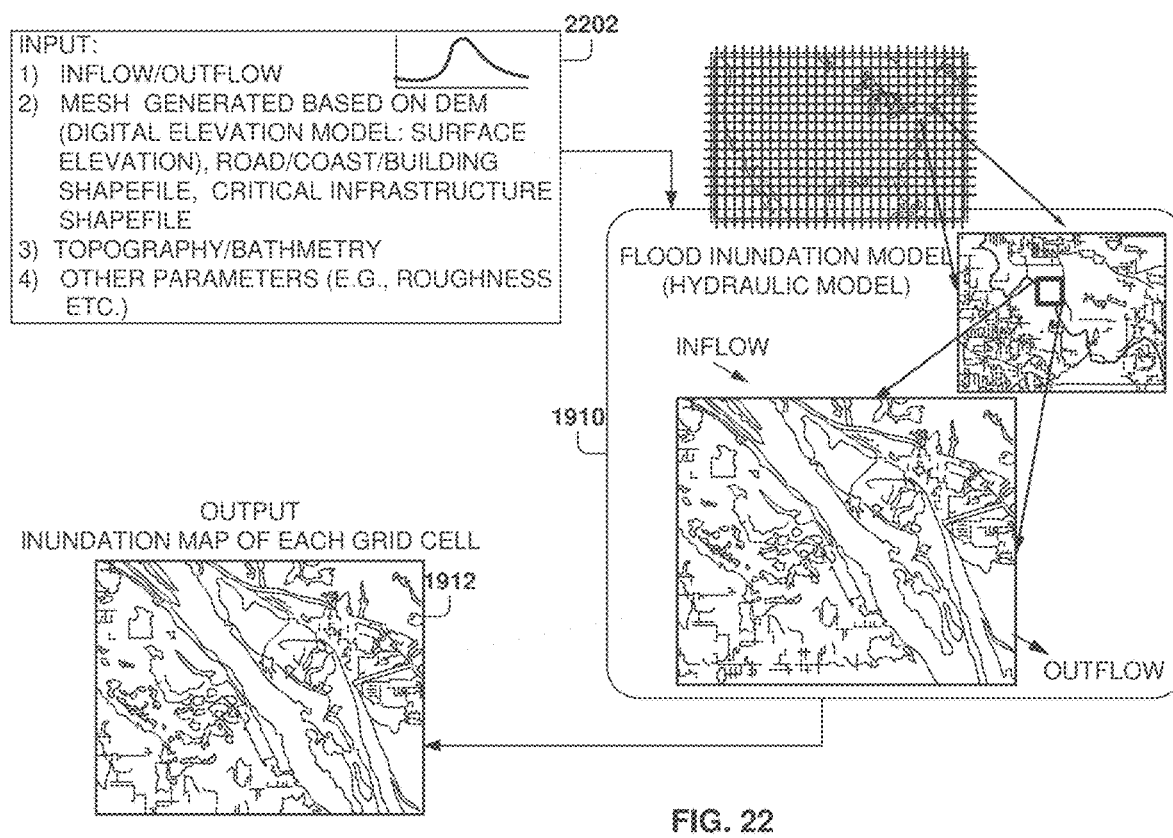
FIG. 22 illustrates functions of a flood inundation model, according to some example embodiments.

FIG. 22 illustrates the functions of the flood inundation model 1910, according to some example embodiments. Once the information in the time series of the inflow and outflow for each location at the river is determined, the flood inundation model 1910 is executed.

It is to be noted that the flood monitor 1906 and the river routing model 1908 are executed frequently in the background. The flood inundation model 1910 is executed once a signal is received from the river routing model 1908 indicating that the time series at one or more places has exceeded the flood stage. In other words, the flood inundation model 1910 is executed when there is a flood condition.

The flood inundation model 1910 simulates what's happening inside each of the grid cells. In the previous operations, the simulation was performed at a larger scale, e.g., at a grid-cell scale. The flood inundation model 1910 simulates the impact of the different obstacles to the water flowing, such as the impact of each tree and each building on the flow of water.

Since the simulation is performed at a fine level, the flood inundation model 1910 uses a large amount of computer resources, depending on the geography being analyzed.

The input 2202 includes one or more of the following: the inflow and outflow of water for each of the cells (e.g., the flow 1916); a mesh based on a Digital Elevation Model (DEM), which represents the elevation of the surface, and shapefiles for roads, coasts, buildings, and critical infrastructure; topography/bathmetry of the region; and other parameters (e.g., roughness of the surface).

The DEM defines land elevation data in the area. The shapefiles define the footprints for elements in the area, such as buildings, roads, and the coastline. In addition, shapefiles for critical assets (e.g., critical infrastructure) may also be received to provide more detailed analysis and more specific information for those critical assets.

The topography/bathmetry provides details for the different features in the area, such as vegetation, water obstacles, bare soil, water depth, etc. The additional parameters, such as surface roughness and other statistical data, may be used to infer certain types of information, such as the land use. A roughness map describes how smooth (or rough) a surface is. When a surface is very smooth (e.g., cement, rock), the water runs fast, but if the surface is rough (e.g., grass, vegetation, trees) then the water will run slowly.

In some cases, the roughness information may be utilized by city managers to alter the surfaces in order to slow down or speed up the flow of water. In general, slow-moving water is better to control flooding, so sometimes city managers may make plans to install vegetation or alter the surfaces of cement waterways.

When mitigation measures are put in place, such as adding sandbags or other water barriers, this information is input to the flood inundation model 1910 to update the geographical mesh, as described in more detail below with reference to FIG. 23. Thus, the mitigation measures alter the water flow, which results in changes to the flood inundation maps 1912. The flood inundation model 1910 needs to know that there is a new wall barrier for the flow of water, and the new wall barrier alters the water flow. This means that there will be more water flowing into certain areas and less water flowing into other areas. The goal is to route the water to the areas that are less critical or that are able to carry the water faster to waterways.

Figure 23:
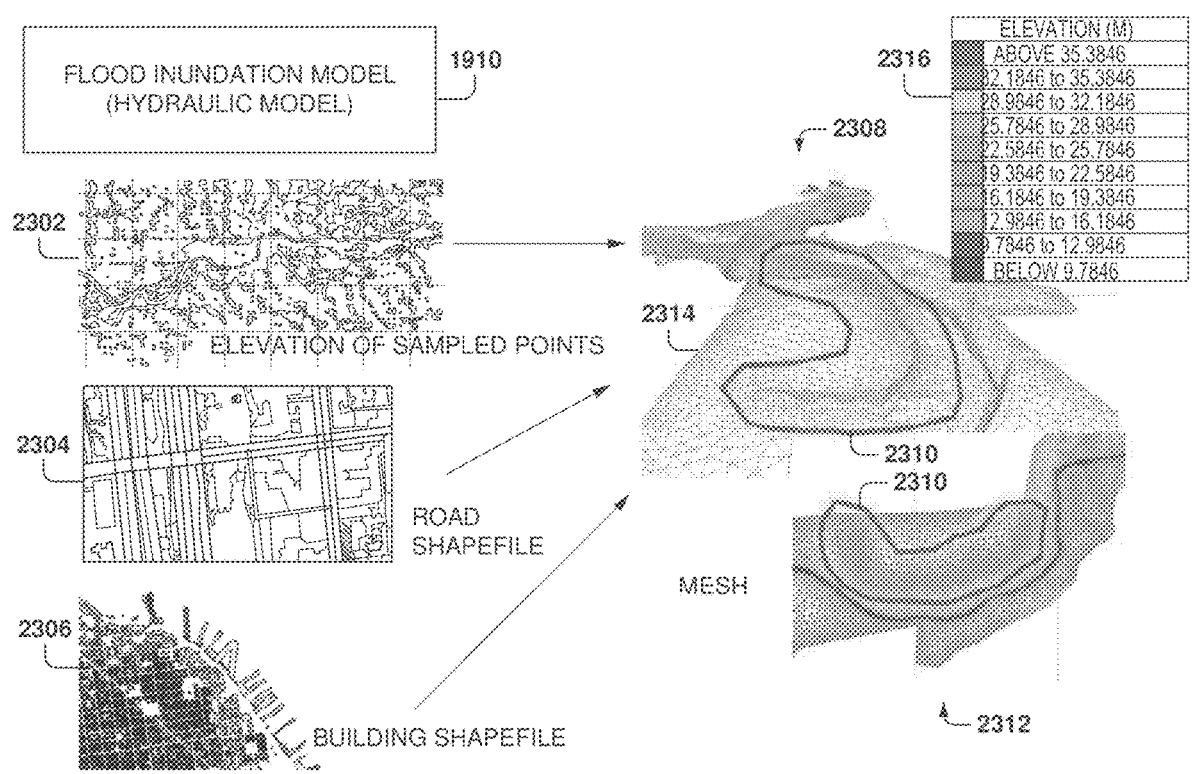
FIG. 23 illustrates an example of the flood inundation model, according to some example embodiments.

FIG. 23 illustrates an example of the flood inundation model 1910, according to some example embodiments. The flood inundation model 1910 combines an elevation of sample points in a map 2302, a road shapefile 2304, and a building shapefile 2306 to calculate a mesh 2314. A shapefile is a geospatial vector data file format that stores latitude/longitude and other attributes as points, lines, or polygons. For example, the data may represent buildings, water wells, rivers, and lakes. Additionally, data attributes are used to describe objects, and data attributes may include, for example, "name" or "temperature."

The mesh 2314 is a division of a geographical surface into sub-cells, e.g., shaped in the form of polygons (or any other suitable shape), that cover the whole geographical surface without overlap. Thus, the mesh 2314 is like a fishnet that covers the ground. In the example of FIG. 23, the mesh 2314 is made of triangles, but other embodiments may utilize other mesh sub-cell polygons with more sides. Each polygon is a sub-cell of the mesh 2314, or, in this example, a triangle.

The flood inundation model 1910 keeps information for each sub-cell, such as land elevation and surface characteristics (e.g., roughness). The size of each sub-cell may vary within the mesh 2314, as certain areas may be more important than others, so the important areas will have smaller sub-cells than less important areas that will have bigger sub-cells. Therefore, there is more information available on the important areas than on the areas that are not as relevant.

In some example embodiments, the side of a triangle represents between 10 and 30 m, but other embodiments may utilize smaller sides (e.g., as small as 1 cm) or larger sides (e.g., as long as 100 m or more). For example, a river that is 10 m wide may have a triangle size of 3 m to keep an adequate amount of information for the riverbed.

FIG. 23 includes a perspective-view map 2308 of the mesh 2314 and a top-view map 2312. Within the mesh 2314, a closed geometric FIG. 2310 indicates the location of a levy, which is of particular importance for determining flooding, as when the levy overflows, then flooding takes place.

As seen in the maps 2308 and 2312, the area around the levy has more triangles, because it is important to keep a large amount of information regarding the levy boundaries. Other areas may include open spaces, further away from the levy, and have larger triangles.

In some example embodiments, the mesh 2314 in the maps 2308 and 2312 is color-coded, as indicated by a color legend table 2316. The color coding allows the manager to get a better perspective on the elevation of the mesh cells. For example, a darker color for the lower areas shows where the waterways are, a green color may indicate low areas next to the levy, and a bright color (e.g., yellow or red) indicates higher-elevation areas that may have lower risk of flooding. The color coding helps in quickly identifying which buildings are at higher risk of flooding.

There is a balance between the size of the triangles and computational resources used required for the flood inundation model 1910. The finer the mesh 2314, the more cells in the mesh, the more computational resources are required to create the flood inundation model 1910. This is why it is important to select small cells in critical areas and larger cells in less critical areas, or areas that may be substantially flat and uniform.

Figure 24:
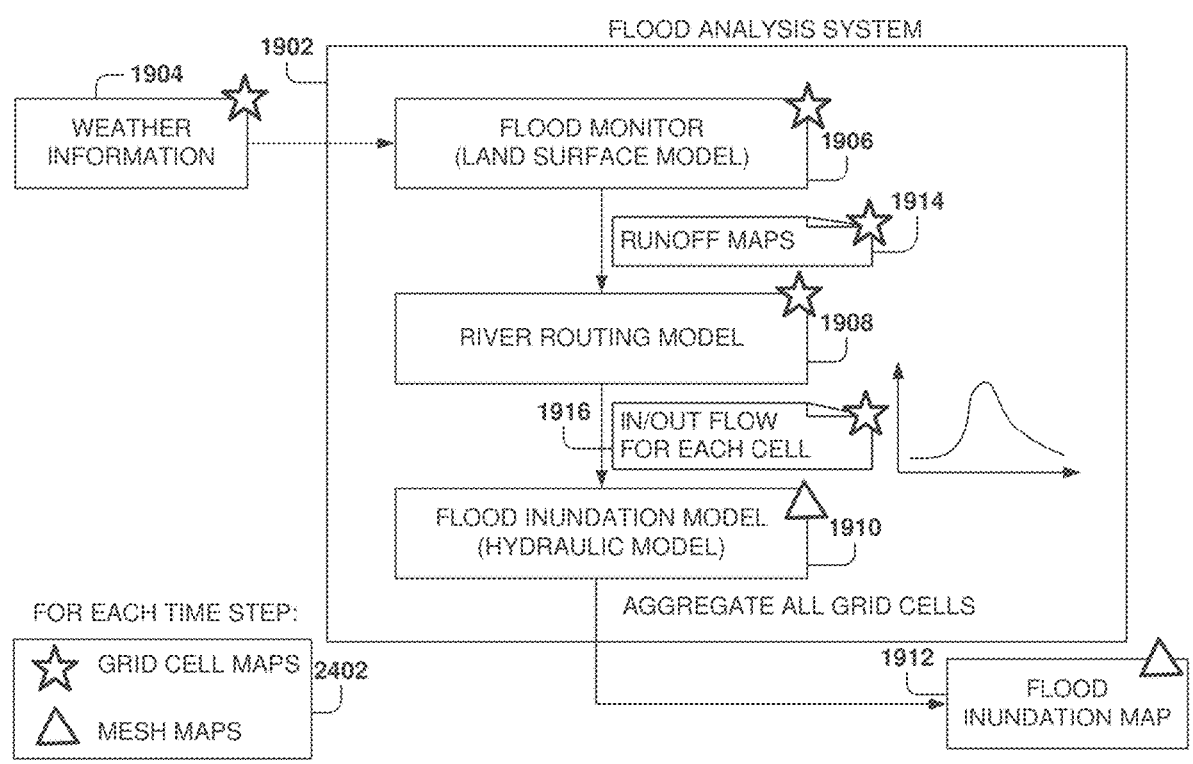
FIG. 24 illustrates the resolution for the different operations of the flood analysis system, according to some example embodiments.

FIG. 24 illustrates the resolution for the different operations of the flood analysis system 1902, according to some example embodiments. As the information is processed through the flood analysis system 1902, the resolution of the different maps changes to finish with a flood inundation map 1912 at a resolution of the mesh.

FIG. 24 illustrates the resolution as indicated by a legend 2402, where a star represents a resolution at the grid level (e.g., 6 km) and a triangle represents a resolution at the mesh level (e.g., 10 m).

Therefore, in some example embodiments, the weather information 1904, the flood monitor 1906, the inundation runoff maps 1914, the river routing model 1908, and the flows 1916 for each cell are at the grid cell size.

The flood inundation model 1910 and the flood inundation maps 1912 are at the mesh size. Thus, initially, the information is processed at the grid level, but then the flood inundation model 1910 uses a finer resolution so the flood analysis system 1902 can generate flood inundation maps 1912 with high resolution, such as at a block level or at a building level.

Figure 25:
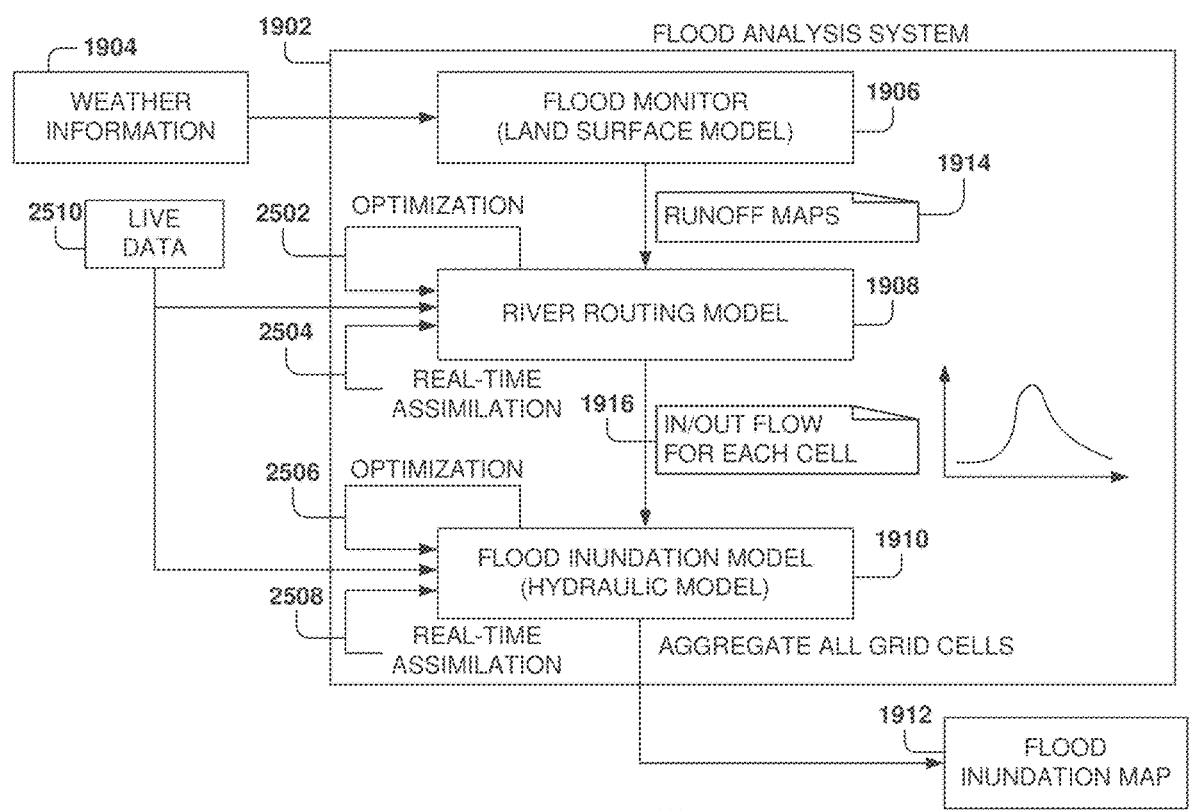
FIG. 25 illustrates the optimization of the flood analysis system with real-time data assimilation, according to some example embodiments.

FIG. 25 illustrates the optimization of the flood analysis system 1902 with real-time data assimilation, according to some example embodiments. The flood analysis system 1902 is a dynamic system that receives live information and simulates the new information to update the flood inundation maps 1912.

In one example embodiment, as new live data 2510 is obtained, the live data 2510 may be input to the river routing model 1908 and the flood inundation model 1910. Additionally, the weather information 1904 may also be updated for the flood monitor 1906. The live data 2510 may be of different types, such as satellite imagery of the region or readings from the stream gauges. There are about 2,000 gauge stations inside of the US, which are located along the rivers and provide real-time water-level readings.

Once the live data 2510 is received, the flood analysis system 1902 updates the flood inundation maps 1912 in real time to have a current vision of the flood predictions. Thus, the flood analysis system 1902 is a live system that can quickly adapt to changing conditions and updated information.

The river routing model 1908 assimilates 2504 in real time the new live data 2510 received, and the flood inundation model 1910 assimilates 2508 the live data 2510.

In some example embodiments, when the live data 2510 is received, a check is made to determine if the live data 2510 (e.g., water depth in some location) is different from the estimated values beyond a predetermined threshold. If the data difference is below the threshold, then the model may not be updated. However, if the data difference is greater than the threshold, a new simulation is performed to update the flood inundation maps 1912.

In addition, by comparison of the estimated values with the actual values coming from the field, the models may be optimized to improve performance. The optimization takes place by adjusting the predicted functions of the models in order to match reality. This means that the feedback information is utilized to optimize 2502 the river routing model 1908 and to optimize 2506 the flood inundation model 1910.

The flood analysis system 1902 is able to continue improving accuracy on the predicted data by simulating real-time information and continuously optimizing the accuracy of the different models. The integration of the three models (the flood monitor 1906, the river routing model 1908, and the flood inundation model 1910) into a live and dynamic system enables the flood analysis system 1902 to generate flood inundation maps 1912 that reflect the reality of what is happening during a storm and assimilate the updates of data received from the field. Additionally, the confidence levels (e.g., as shown in the chart 1410 of FIG. 14) keep improving as new data is available and as the time to prediction is reduced.

Figure 26:
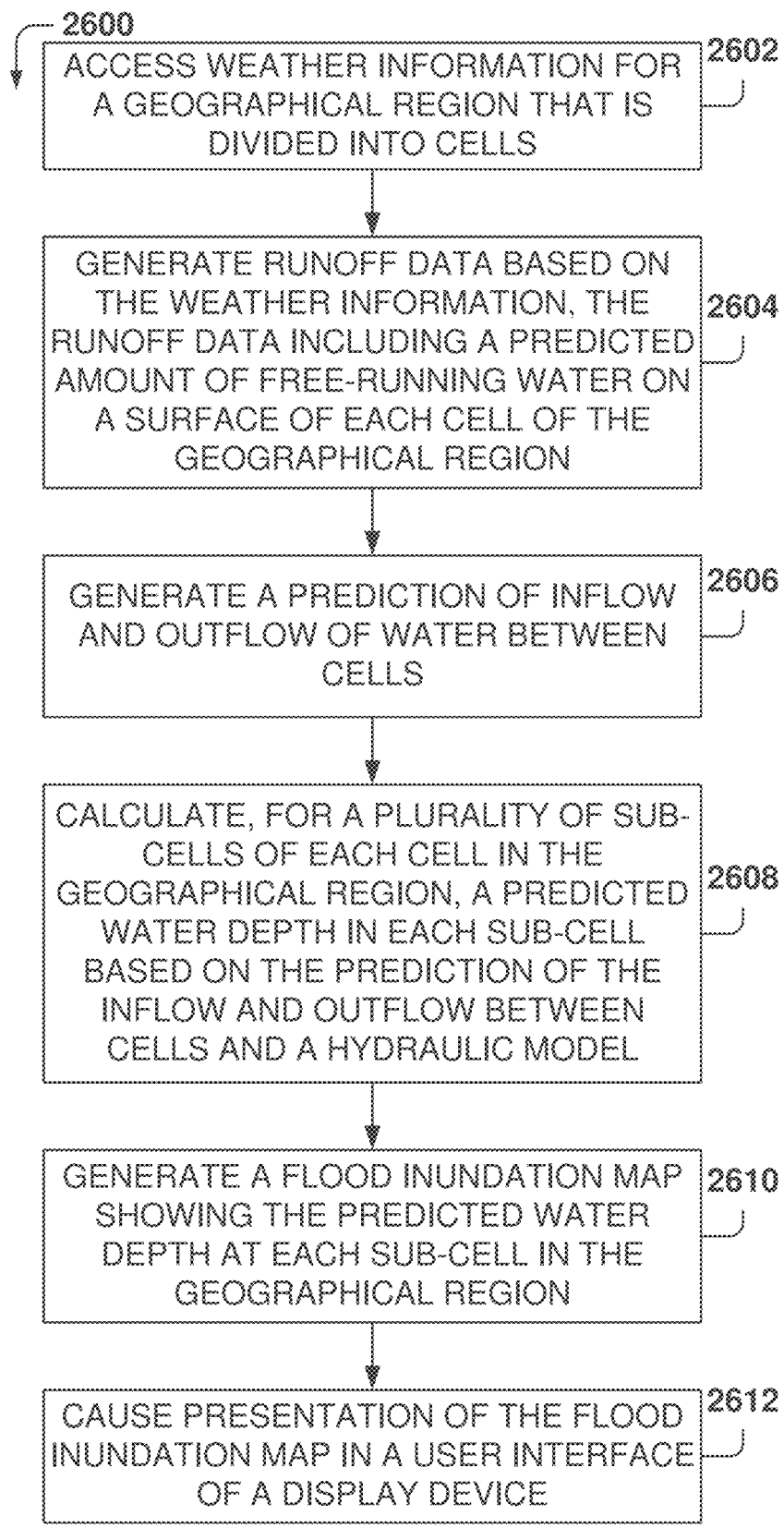
FIG. 26 is a flowchart of a method, according to some example embodiments, for a flood monitoring and management system.

FIG. 26 is a flowchart of a method 2600, according to some example embodiments, for a flood monitoring and management system. Operation 2602 is for accessing, by one or more processors of a flood analysis system, weather information for a geographical region that is divided into cells.

From operation 2602, the method flows to operation 2604 for generating, by the one or more processors of the flood analysis system, runoff data based on the weather information. The runoff data includes a predicted amount of free-running water on a surface of each cell of the geographical region.

From operation 2604, the method flows to operation 2606, where the one or more processors of the flood analysis system generate a prediction of inflow and outflow of water between cells. From operation 2606, the method flows to operation 2608 for calculating, for a plurality of sub-cells of each cell in the geographical region, a predicted water depth in each sub-cell based on the prediction of the inflow and outflow between cells and a hydraulic model.

From operation 2608, the method flows to operation 2610, where the one or more processors of the flood analysis system generate a flood inundation map showing the predicted water depth at each sub-cell in the geographical region.

From operation 2610, the method flows to operation 2612 for causing, by the one or more processors of the flood analysis system, presentation of the flood inundation map in a user interface of a display device.

In one example, the user interface includes a timeline bar, the timeline bar including a selected time and a plurality of selectable times, wherein selecting a different time from the plurality of selectable times causes an update of the flood inundation map for the different time.

In one example, the method 2600 further comprises accessing new water-depth data for one or more sub-cells, and recalculating the flood inundation map based on the new water-depth data.

In one example, calculating the predicted water depth in each sub-cell further comprises generating a mesh of the geographical region, the mesh being a division of the geographical region into sub-cells that cover the geographical region without overlap; and identifying water level at each sub-cell of the mesh based on an elevation and a type of surface of the sub-cell.

In one example, each sub-cell is a polygon having sides with a size in a range from one to twenty meters.

In one example, the method 2600 further comprises tracking assets in the geographical region, and providing, in the user interface, flooding information for the assets in the geographical region.

In one example, generating the runoff data further comprises utilizing a hydrological model to generate the runoff data.

In one example, generating the prediction of the inflow and outflow of each cell further comprises accessing data for a river network, the data for the river network including cells in the river network and statistical parameters of the river network; and generating the prediction of the inflow and outflow of each cell based on the data for the river network.

In one example. the method 2600 further comprises estimating damages in the geographical region due to flooding, and presenting the estimated damages in the user interface.

In one example, the user interface includes options for presenting rainfall level, color-coded water depth, assets impacted by flooding, and estimate of loss caused by flooding.

Figure 27:
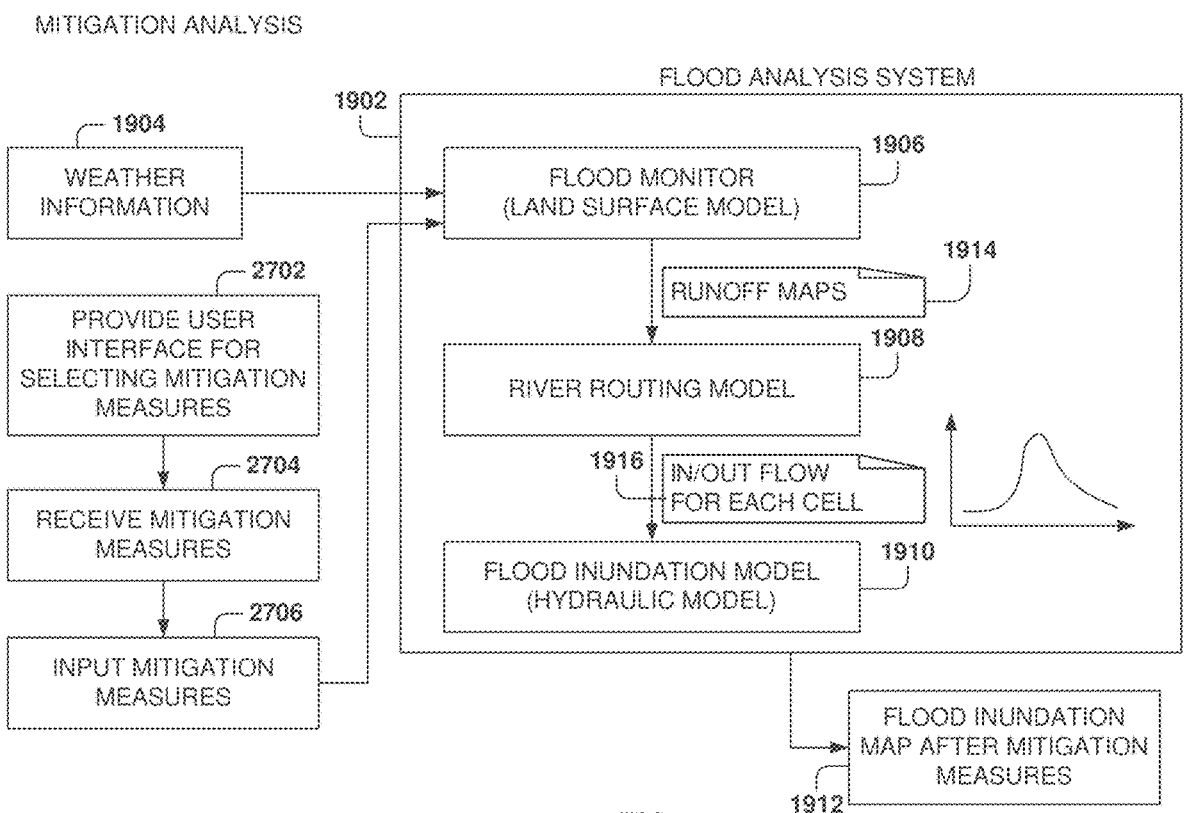
FIG. 27 illustrates a system for mitigation analysis, according to some example embodiments.

FIG. 27 illustrates a system for mitigation analysis, according to some example embodiments. As discussed above, the flood analysis system 1902 may be used to predict inundation for an incoming storm and may be used to analyze the effect of mitigation measures that the city officials may put in place to reduce the damage from flooding.

At operation 2702, a user interface is provided to the manager for selecting mitigation measures, as illustrated, for example, in FIG. 15. The manager may select where to place water barriers, such as sandbags, to control the flow of water over the surface.

From operation 2702, the method flows to operation 2704, where the mitigation measures are received from the manager via the user interface. At operation 2706, the mitigation measures are input into the flood analysis system 1902, which then recalculates the flood inundation maps 1912 as though the mitigation measures were in place.

The mitigation measures may, for example, affect the flood inundation model 1910 by changing the mesh 2314. That is, the data for some of the cells in the mesh 2314 changes to reflect the changes due to the mitigation measures. For example, the height of one or more triangles may increase, as well as the type of surface of the one or more triangles.

Figure 28:
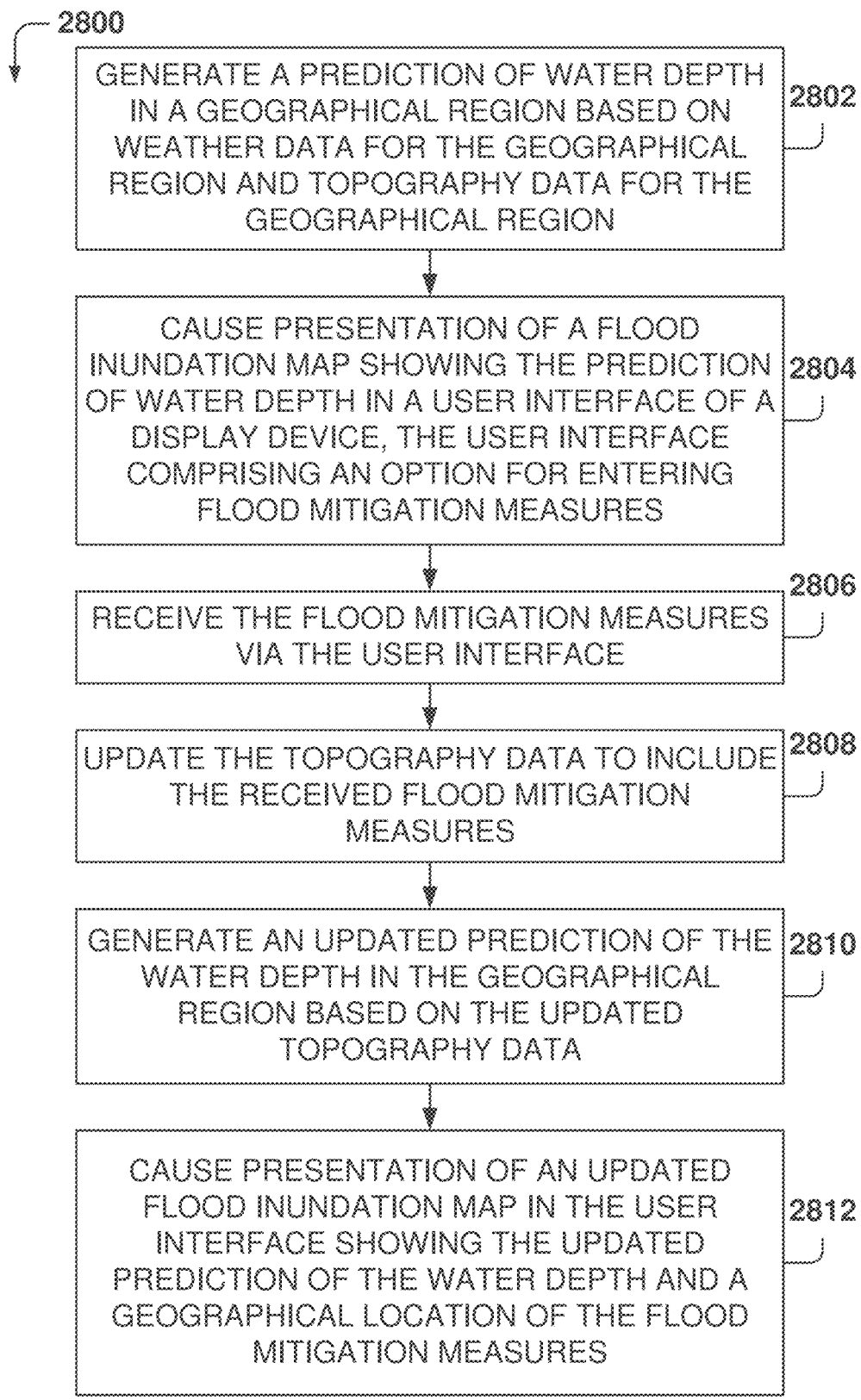
FIG. 28 is a flowchart of a method, according to some example embodiments, for a flood-recovery analysis tool.

FIG. 28 is a flowchart of a method 2800, according to some example embodiments, for a flood-recovery analysis tool. Operation 2802 is for generating, by one or more processors of a flood analysis system, a prediction of water depth in a geographical region based on weather data for the geographical region and topography data for the geographical region.

From operation 2802, the method flows to operation 2804 for causing, by the one or more processors of the flood analysis system, presentation of a flood inundation map showing the prediction of water depth in a user interface of a display device, the user interface comprising an option for entering flood mitigation measures.

From operation 2804, the method flows to operation 2806, where the one or more processors of the flood analysis system receive the flood mitigation measures via the user interface. From operation 2806, the method flows to operation 2808 for updating, by the one or more processors of the flood analysis system, the topography data to include the received flood mitigation measures.

From operation 2808, the method flows to operation 2810 for generating, by the one or more processors of the flood analysis system, an updated prediction of the water depth in the geographical region based on the updated topography data.

From operation 2810, the method flows to operation 2812 for causing, by the one or more processors of the flood analysis system, presentation of an updated flood inundation map in the user interface, the updated flood inundation map showing the updated prediction of the water depth and a geographical location of the flood mitigation measures.

In one example, the flood mitigation measures include placing water barriers selected from a group consisting of sandbags, rock fill cellular barriers, soil fill cellular barriers, concrete fill cellular barriers, fabric fall-back-walls, wood barriers, steel barriers, concrete barriers, water-filled tubular systems, and air-filled tubular systems.

In one example, the user interface includes an option for placing the flood mitigation measures by selecting a location in the flood inundation map.

In one example, the method 2800 further comprises calculating first damages caused by flooding before placing the flood mitigation measures, calculating second damages caused by flooding after placing the flood mitigation measures, and presenting the first damages and the second damages in the user interface.

In one example, the method 2800 further comprises determining first assets damaged by flooding before placing the flood mitigation measures, determining second assets damaged by flooding after placing the flood mitigation measures, and presenting the first assets and the second assets in the user interface.

In one example, the user interface includes a timeline bar, the timeline bar including a selected time and a plurality of selectable times, wherein the prediction of the water depth is generated for the selected time, wherein selecting a different time from the plurality of selectable times causes update of the prediction of the water depth for the different time.

In one example, the method 2800 further comprises presenting in the user interface a mitigation failing risk indicator.

In one example, generating the prediction of the water depth further comprises generating a mesh of the geographical region, the mesh being a division of the geographical region into sub-cells that cover the geographical region without overlap; and identifying water level at each sub-cell of the mesh based on an elevation and a type of surface of the sub-cell, wherein updating the topography data includes updating one or more of the elevation and the type of surface of the sub-cell.

In one example, the user interface includes an icon placed in the flood inundation map showing the flood mitigation measures.

In one example, the user interface includes options for presenting rainfall level, color-coded water depth, assets impacted by flooding, and an estimate of loss caused by flooding.

Figure 29:
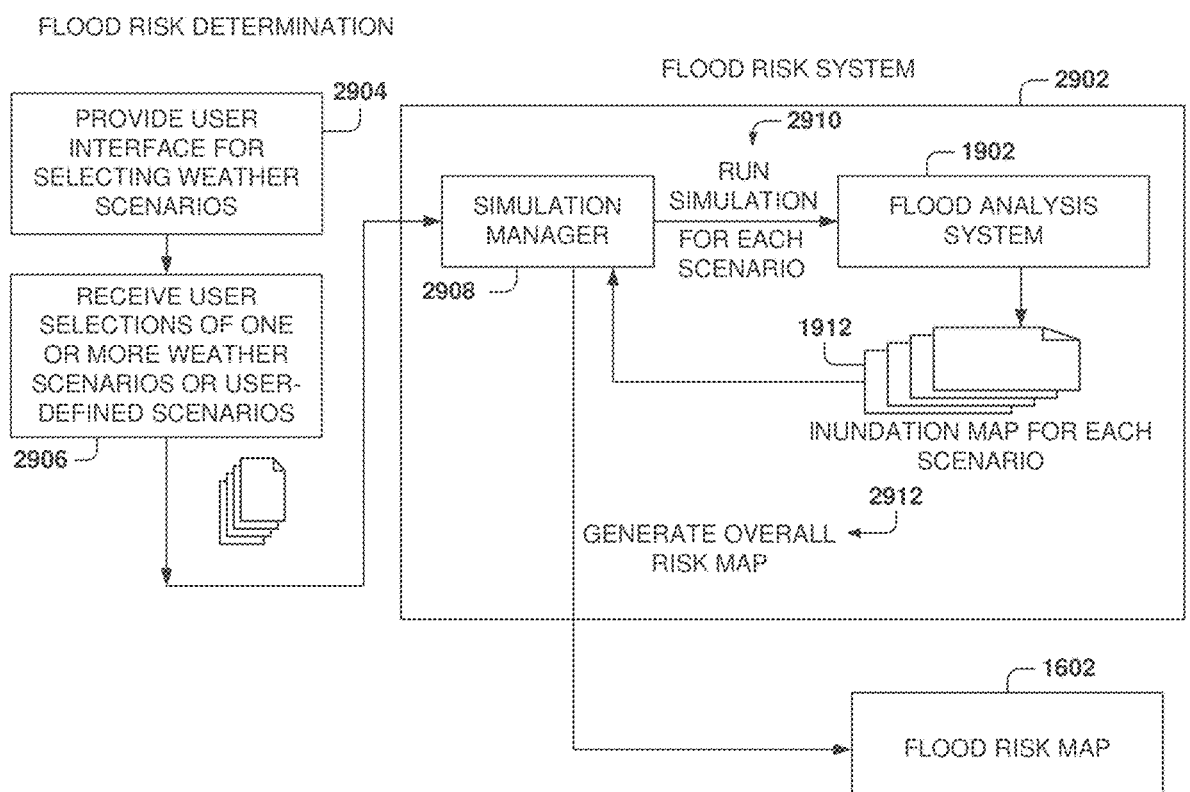
FIG. 29 illustrates the determination of the flood-risk map, according to some example embodiments.

FIG. 29 illustrates the determination of the flood-risk map 1602, according to some example embodiments. In some example embodiments, a user interface is provided at operation 2904, the user interface being for selecting one or more weather scenarios for calculating flood risk. See, for example, the user interface illustrated in FIG. 11.

From operation 2904, the method flows to operation 2906, where one or more user selections are received, the user selections being for one or more weather scenarios or one or more user-defined scenarios.

The user selections are then inputted to a simulation manager 2908 within a flood-risk system 2902. The simulation manager 2908 then runs a simulation for each defined scenario by inputting the scenarios to the flood analysis system 1902. The flood analysis system 1902 then generates the flood inundation maps 1912 for each of the scenarios.

The simulation manager 2908 generates 2912 the overall flood-risk map 1602 by combining the information provided by the flood inundation maps 1912 resulting from each of the scenarios. In some example embodiments, the overall flood risk map is calculated by averaging values from the inundation maps for each of the simulations. In our example embodiments, a probability is assigned to each of the scenarios, and the overall flood risk map is calculated by adding the inundation maps weighted by their probability. In other example embodiments, the overall flood risk map 1602 is calculated by selecting one or more scenarios with the worst flooding and then combining the selected one or more scenarios. In some example embodiments, the simulations from each of the scenarios are combined by averaging the top $5^{th}$ percentile in severity values, but other ways to combine the scenarios are also possible.

In other approaches, such as that of the flood maps generated by FEMA, flood maps with return periods of 100 years and 500 years are calculated. This means that the flood is expected to happen once in 100 or 500 years based on historical statistical data.

The FEMA model is based on the statistical analysis of past weather in flooding data. However, in many places, this type of data is only available for the last 20 or 30 years. Therefore, the statistical analysis extrapolates the data to calculate the 100-year event.

Further, the FEMA model does not take into consideration climate change, because the model is based on past data. But the weather patterns are changing, and by generating weather scenarios based on climate change, the flood-risk system 2902 may generate predicted risk maps with better accuracy. For example, with climate change, the rainfall amounts are constantly changing, including the distributions of rain rates in different locations. It is believed that the dry areas will become dryer and wet areas may become wetter. For example, the flooding in Harris County is a type of flooding that was completely unexpected according to the analysis of previous climate patterns. The climate change model is able to take into consideration the new weather patterns.

In some example embodiments, the climate changes are based on the climate-change data provided by IPCC, the Intergovernmental Panel on Climate Change, but other sources of climate-change data may be used.

Figure 30:
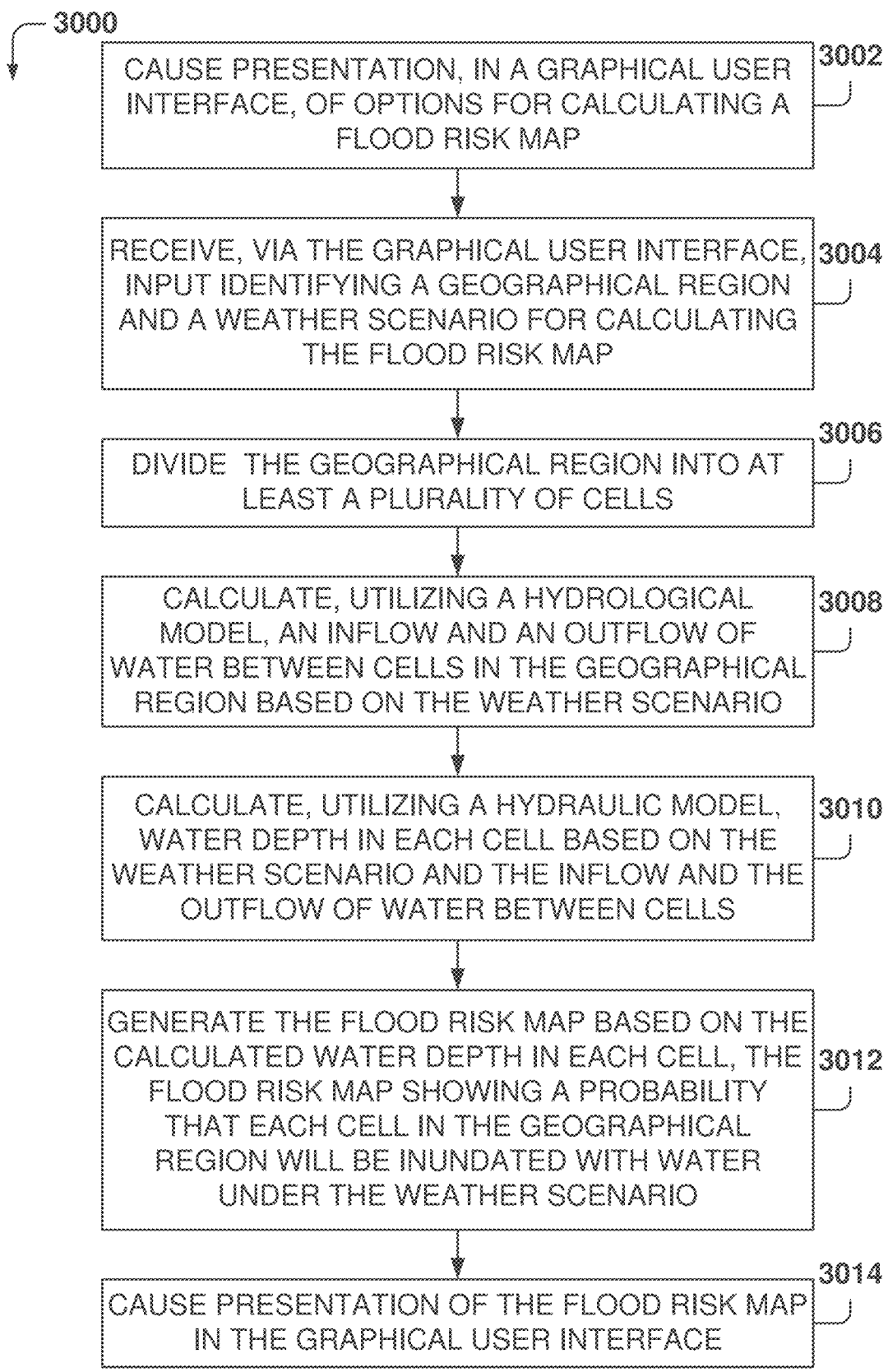
FIG. 30 is a flowchart of a method, according to some example embodiments, for flood-risk analysis and mapping.

FIG. 30 is a flowchart of a method 3000, according to some example embodiments, for flood-risk analysis and mapping. Operation 3002 is for causing, by one or more processors of a flood analysis system, presentation, in a graphical user interface, of options for calculating a flood risk map.

From operation 3002, the method flows to operation 3004 for receiving, via the graphical user interface, input identifying a geographical region and a weather scenario for calculating the flood risk map.

From operation 3004, the method flows to operation 3006 where the one or more processors of the flood analysis system divide the geographical region into at least a plurality of cells.

From operation 3006, the method flows to operation 3008 for calculating, utilizing a hydrological model, an inflow and an outflow of water between cells in the geographical region based on the weather scenario.

From operation 3008, the method flows to operation 3010 for calculating, utilizing a hydraulic model, water depth in each cell based on the weather scenario and the inflow and the outflow of water between cells.

From operation 3010, the method flows to operation 3012 for generating, by the one or more processors of the flood analysis system, the flood risk map based on the calculated water depth in each cell. The flood risk map shows a probability that each cell in the geographical region will be inundated with water under the weather scenario.

From operation 3012, the method flows to operation 3014 for causing, by the one or more processors of the flood analysis system, presentation of the flood risk map in the graphical user interface.

In one example, options for identifying the weather scenario includes selecting one or more of: a 30-year rainfall scenario, a 50-year rainfall scenario, or a 100-year weather scenario; a weather event that occurred in the past; a climate scenario; wind; temperature; or land use.

In one example, generating the flood risk map further comprises calculating water depth for each cell for a plurality of weather events, and averaging values of the water depth in each cell for the plurality of weather patterns.

In one example, generating the flood risk map further comprises assigning a probability to each of the weather events, and adding values, weighted by the assigned probability, of the water depth in each cell for each weather event.

In one example, the graphical user interface includes a first option for selecting a weather scenario based on climate change.

In one example, the method 3000 further includes dividing each cell into a plurality of sub-cells, where the hydraulic model calculates the water depth for each sub-cell.

In one example, the graphical user interface includes a second option for adding mitigation measures.

In one example, the mitigation measures include one or more of elevating a structure or buying a property.

In one example, the method 3000 further includes calculating a cost of applying the mitigation measures; calculating a benefit of applying the mitigation measures, the benefit being calculated based on damages avoided in case of flooding; and presenting, in the graphical user interface, the cost and benefit.

In one example, generating the flood risk map further includes assigning a flood risk indicator to each cell in the geographical region based on the probability that the cell will be inundated, the flood risk indicator for each cell being selected from a plurality of predefined risk indicators; and presenting the flood risk indicators in the flood risk map, each of the plurality of predefined risk indicators being color-coded with a different color in the flood risk map.

Figure 31:
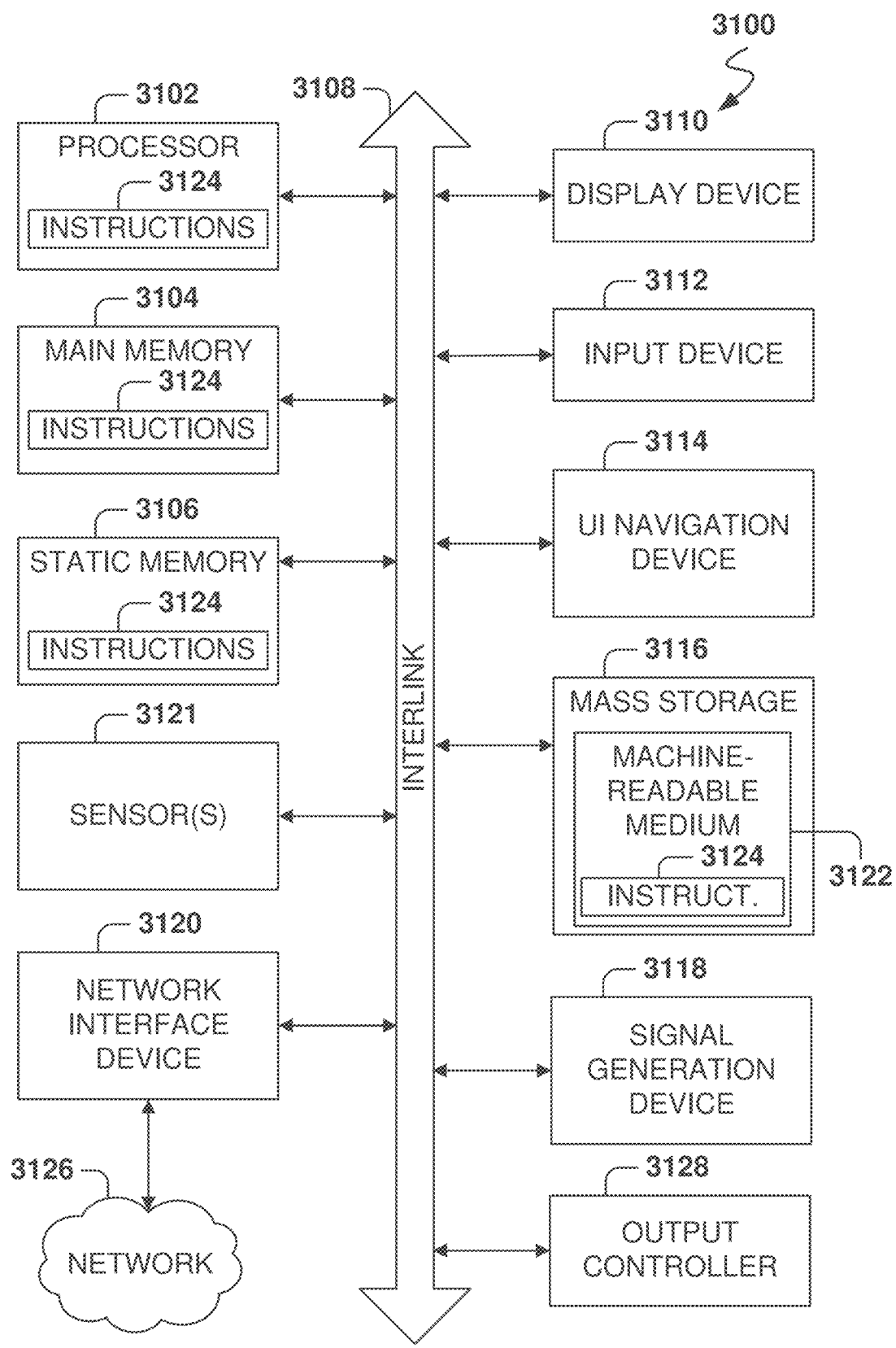
FIG. 31 is a block diagram illustrating components of a machine, according to some example embodiments, able to read instructions from a machine-readable medium and perform any one or more of the methodologies discussed herein.

FIG. 31 is a block diagram illustrating an example of a machine 3100 upon which one or more example process embodiments described herein may be implemented or controlled. In alternative embodiments, the machine 3100 may operate as a standalone device or may be connected (e.g., networked) to other machines. In a networked deployment, the machine 3100 may operate in the capacity of a server machine, a client machine, or both in server-client network environments. In an example, the machine 3100 may act as a peer machine in a peer-to-peer (P2P) (or other distributed) network environment. Further, while only a single machine 3100 is illustrated, the term "machine" shall also be taken to include any collection of machines that individually or jointly execute a set (or multiple sets) of instructions to perform any one or more of the methodologies discussed herein, such as via cloud computing, software as a service (SaaS), or other computer cluster configurations.

Examples, as described herein, may include, or may operate by, logic, a number of components, or mechanisms. Circuitry is a collection of circuits implemented in tangible entities that include hardware (e.g., simple circuits, gates, logic, etc.). Circuitry membership may be flexible over time and underlying hardware variability. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, by moveable placement of invariant massed particles, etc.) to encode instructions of the specific operation. In connecting the physical components, the underlying electrical properties of a hardware constituent are changed (for example, from an insulator to a conductor or vice versa). The instructions enable embedded hardware (e.g., the execution units or a loading mechanism) to create members of the circuitry in hardware via the variable connections to carry out portions of the specific operation when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 3100 may include a hardware processor 3102 (e.g., a central processing unit (CPU), a hardware processor core, or any combination thereof), a graphics processing unit (GPU) 3103, a main memory 3104, and a static memory 3106, some or all of which may communicate with each other via an interlink (e.g., bus) 3108. The machine 3100 may further include a display device 3110, an alphanumeric input device 3112 (e.g., a keyboard), and a user interface (UI) navigation device 3114 (e.g., a mouse). In an example, the display device 3110, alphanumeric input device 3112, and UI navigation device 3114 may be a touch screen display. The machine 3100 may additionally include a mass storage device (e.g., drive unit) 3116, a signal generation device 3118 (e.g., a speaker), a network interface device 3120, and one or more sensors 3121, such as a Global Positioning System (GPS) sensor, compass, accelerometer, biometric sensor, or other sensor. The machine 3100 may include an output controller 3128, such as a serial (e.g., universal serial bus (USB)), parallel, or other wired or wireless (e.g., infrared (IR), near field communication (NFC), etc.) connection to communicate with or control one or more peripheral devices (e.g., a printer, card reader, etc.).

The mass storage device 3116 may include a machine-readable medium 3122 on which is stored one or more sets of data structures or instructions 3124 (e.g., software)

embodying or utilized by any one or more of the techniques or functions described herein. The instructions 3124 may also reside, completely or at least partially, within the main memory 3104, within the static memory 3106, within the hardware processor 3102, or within the GPU 3103 during execution thereof by the machine 3100. In an example, one or any combination of the hardware processor 3102, the GPU 3103, the main memory 3104, the static memory 3106, or the mass storage device 3116 may constitute machine-readable media.

While the machine-readable medium 3122 is illustrated as a single medium, the term "machine-readable medium" may include a single medium or multiple media (e.g., a centralized or distributed database, and/or associated caches and servers) configured to store the one or more instructions 3124.

The term "machine-readable medium" may include any medium that is capable of storing, encoding, or carrying instructions 3124 for execution by the machine 3100 and that cause the machine 3100 to perform any one or more of the techniques of the present disclosure, or that is capable of storing, encoding, or carrying data structures used by or associated with such instructions 3124. Non-limiting machine-readable medium examples may include solid-state memories, and optical and magnetic media. In an example, a massed machine-readable medium comprises a machine-readable medium 3122 with a plurality of particles having invariant (e.g., rest) mass. Accordingly, massed machine-readable media are not transitory propagating signals. Specific examples of massed machine-readable media may include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 3124 may further be transmitted or received over a communications network 3126 using a transmission medium via the network interface device 3120.

As used herein, the term "memory" refers to a machine-readable medium able to store data temporarily or permanently and may be taken to include, but not be limited to, random-access memory (RAM), read-only memory (ROM), buffer memory, flash memory, and cache memory. While the machine-readable medium 3122 is shown in an example embodiment to be a single medium, the term "machine-readable medium" should be taken to include a single medium or multiple media (e.g., a centralized or distributed database, or associated caches and servers) able to store the instructions 3124. The term "machine-readable medium" shall also be taken to include any medium, or combination of multiple media, that is capable of storing the instructions 3124 for execution by the machine 3100, such that the instructions 3124, when executed by one or more processors of the machine 3100 (e.g., the processor 3102), cause the machine 3100 to perform any one or more of the methodologies described herein, in whole or in part. Accordingly, a "machine-readable medium" refers to a single storage apparatus or device, as well as cloud-based storage systems or storage networks that include multiple storage apparatus or devices. The term "machine-readable medium" shall accordingly be taken to include, but not be limited to, one or more tangible (e.g., non-transitory) data repositories in the form of a solid-state memory, an optical medium, a magnetic medium, or any suitable combination thereof.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of components, modules, or mechanisms. Modules may constitute software modules (e.g., code stored or otherwise embodied on a machine-readable medium or in a transmission medium), hardware modules, or any suitable combination thereof. A "hardware module" is a tangible (e.g., non-transitory) unit capable of performing certain operations and may be configured or arranged in a certain physical manner. In various example embodiments, one or more computer systems (e.g., a standalone computer system, a client computer system, or a server computer system) or one or more hardware modules of a computer system (e.g., a processor or a group of processors) may be configured by software (e.g., an application or application portion) as a hardware module that operates to perform certain operations as described herein.

In some embodiments, a hardware module may be implemented mechanically, electronically, or any suitable combination thereof. For example, a hardware module may include dedicated circuitry or logic that is permanently configured to perform certain operations. For example, a hardware module may be a special-purpose processor, such as a field-programmable gate array (FPGA) or an ASIC. A hardware module may also include programmable logic or circuitry that is temporarily configured by software to perform certain operations. For example, a hardware module may include software encompassed within a general-purpose processor or other programmable processor. It will be appreciated that the decision to implement a hardware module mechanically, in dedicated and permanently configured circuitry, or in temporarily configured circuitry (e.g., configured by software) may be driven by cost and time considerations.

Accordingly, the phrase "hardware module" should be understood to encompass a tangible entity, and such a tangible entity may be physically constructed, permanently configured (e.g., hardwired), or temporarily configured (e.g., programmed) to operate in a certain manner or to perform certain operations described herein. As used herein, "hardware-implemented module" refers to a hardware module. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software (e.g., a software module) may accordingly configure one or more processors, for example, to constitute a particular hardware module at one instance of time and to constitute a different hardware module at a different instance of time.

Hardware modules may provide information to, and receive information from, other hardware modules. Accordingly, the described hardware modules may be regarded as being communicatively coupled. Where multiple hardware modules exist contemporaneously, communications may be achieved through signal transmission (e.g., over appropriate circuits and buses) between or among two or more of the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and may operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions described herein. As used herein, "processor-implemented module" refers to a hardware module implemented using one or more processors.

Similarly, the methods described herein may be at least partially processor-implemented, a processor being an example of hardware. For example, at least some of the operations of a method may be performed by one or more processors or processor-implemented modules. As used herein, "processor-implemented module" refers to a hardware module in which the hardware includes one or more processors. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an application programming interface (API)).

The performance of certain operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Some portions of the subject matter discussed herein may be presented in terms of algorithms or symbolic representations of operations on data stored as bits or binary digital signals within a machine memory (e.g., a computer memory). Such algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or any suitable combination thereof), registers, or other machine components that receive, store, transmit, or display information. Furthermore, unless specifically stated otherwise, the terms "a" or "an" are herein used, as is common in patent documents, to include one or more than one instance. Finally, as used herein, the conjunction "or" refers to a non-exclusive "or," unless specifically stated otherwise.

Although an overview of the present subject matter is described with reference to specific example embodiments, various modifications and changes may be made to these example embodiments without departing from the broader scope of embodiments of the present disclosure. Such example embodiments of the present subject matter may be referred to herein, individually or collectively, by the term "invention" merely for convenience and without intending to voluntarily limit the scope of this application to any single disclosure or present concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

What is claimed is:

1. A method comprising:
  accessing, by one or more processors of a flood analysis system, weather information for a geographical region that is divided into cells;
  generating, by the one or more processors of the flood analysis system utilizing a hydrological model, runoff data based on the weather information, the runoff data including a predicted amount of free-running water on a surface of each cell of the geographical region for a plurality of times;
  generating, by the one or more processors of the flood analysis system, a prediction of inflow and outflow of water between cells for the plurality of times;
  calculating, for a plurality of sub-cells of each cell in the geographical region, a predicted water depth, for the plurality of times, in each sub-cell based on the prediction of the inflow and outflow between cells and a hydraulic model;
  generating, by the one or more processors of the flood analysis system, a flood inundation map showing the predicted water depth at each sub-cell in the geographical region at one of the times from the plurality of times;

causing, by the one or more processors of the flood analysis system, presentation of the flood inundation map in a user interface of a display device;

tracking asset information for assets in the geographical region, the asset information including type of asset, building material, year of construction, and asset location;

calculating a number of assets in the geographical region that are impacted by flooding based on identification of assets impacted by flooding;

estimating damages for the assets in the geographical region due to the flooding based on identification of assets impacted by flooding, the asset information, the predicted water depth at each cell and flooding information for the assets in the geographical region;

tracking a number of people in the geographical region affected by the flooding based on number of people affected in each block; and presenting, in the user interface, the number of assets impacted by flooding, the estimated damages for the assets, and the number of people affected by the flooding in the geographical region.

2. The method as recited in claim I, further comprising:
accessing one or more live measurements of water-depth data from one or more stream gauges; and
recalculating the flood inundation map based on the one or more live measurements of water-depth data and the predicted water depth.

3. The method as recited in claim 1, wherein calculating the predicted water depth in each sub-cell further comprises:
generating a mesh of the geographical region, the mesh being a division of the geographical region into sub-cells that cover the geographical region without overlap; and
identifying water level at each sub-cell of the mesh based on an elevation and a type of surface of the sub-cell.

4. The method as recited in claim 3, wherein each sub-cell is a polygon having sides with a size in a range from one to twenty meters.

5. The method as recited in claim 1, wherein generating the prediction of the inflow and outflow of each cell further comprises:
accessing data for a river network, the data for the river network including cells in the river network and statistical parameters of the river network; and
generating the prediction of the inflow and outflow of each cell based on the data for the river network.

6. The method as recited in claim 1, wherein the user interface includes options for presenting rainfall level, color-coded water depth, assets impacted by flooding, and estimate of loss caused by flooding.

7. The method as recited in claim I, wherein causing presentation of the flood inundation map further includes:
assigning a flood risk indicator to each cell in the geographical region based on a probability that the cell will he inundated, the flood risk indicator for each cell being selected from a plurality of predefined risk indicators; and
presenting the flood risk indicators in the flood inundation map, each of the plurality of predefined risk indicators being color-coded with a different color in the flood inundation map.

8. The method as recited in claim 1, further comprising:
identifying blocks in the geographical region;
tracking a number of people affected by flooding in each block of the geographical region;
tracking a number of buildings in each block affected by the flooding; and
presenting, in the user interface, the number of people and the number of buildings in each block affected by the flooding.

9. The method as recited in claim 1, further comprising:
receiving updates with water-depth data from the geographical region; and
updating models for calculating the water depth based on the received updates.

10. The method as recited in claim 1, wherein generating the flood inundation map further comprises:
presenting waterways in the flood inundation map with a first color; and
presenting flooded areas next to the waterways in a second color.

11. The method as recited in claim 1, further comprising:
providing statistics on assets impacted based on the predicted water depth.

12. A non-transitory machine-readable storage medium including instructions that, when executed by a machine, cause the machine to perform operations comprising:
accessing weather information for a geographical region that is divided into cells;
generating, utilizing a hydrological model, runoff data based on the weather information, the runoff data including a predicted amount of free-running water on a surface of each cell of the geographical region for a plurality of times;
generating a prediction of inflow and outflow of water between cells for the plurality of times;
calculating, for a plurality of sub-cells of each cell in the geographical region, a predicted water depth, for the plurality of times, in each sub-cell based on the prediction of the inflow and outflow between cells and a hydraulic model;
generating a flood inundation map showing the predicted water depth at each sub-cell in the geographical region at one of the times from the plurality of times;
causing presentation of the flood inundation map in a user interface of a display device;
tracking asset information for assets in the geographical region, the asset information including type of asset, building material, year of construction, and asset location;
calculating a number of assets in the geographical region that are impacted by flooding based on identification of assets impacted by flooding;
estimating damages for the assets in the geographical region due to the flooding based on identification of assets impacted by flooding, the asset information, the predicted water depth at each cell and flooding information for the assets in the geographical region;
tracking a number of people in the geographical region affected by the flooding based on number of people affected in each block; and
presenting, in the user interface, the number of assets impacted by flooding, the estimated damages for the assets, and the number of people affected by the flooding in the geographical region.

13. The machine-readable storage medium as recited in claim 12, wherein the machine further performs operations comprising:
accessing one or more live measurements of water-depth data from one or more stream gauges; and recalculating the flood inundation map based on the one or more live measurements of water-depth data and the predicted water depth.

14. The machine-readable storage medium as recited in claim 12, wherein calculating the predicted water depth in each sub-cell further comprises:
generating a mesh of the geographical region, the mesh being a division of the geographical region into sub-cells that cover the geographical region without overlap; and
identifying water level at each sub-cell of the mesh based on an elevation and a type of surface of the sub-cell.

\* \* \* \* \*